United States Patent
Matsuyama et al.

(10) Patent No.: US 6,238,283 B1
(45) Date of Patent: May 29, 2001

(54) DOUBLE-SEALED WORK CONVEYING AND TRANSFERRING APPARATUS AND CONTAINER INSPECTING METHOD

(75) Inventors: Ryoji Matsuyama, Kawasaki; Koji Hashizume, Kasugai; Toshikatsu Shimura; Masahiro Nishi, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/496,962

(22) Filed: Feb. 3, 2000

(30) Foreign Application Priority Data

Mar. 17, 1999 (JP) .................................................. 11-072162
Aug. 31, 1999 (JP) .................................................. 11-245478

(51) Int. Cl.[7] ...................................................... B01L 1/04
(52) U.S. Cl. ............................................ 454/187; 414/939
(58) Field of Search ............................ 454/187; 414/939, 414/940, 941, 225.01, 226.05

(56) References Cited

U.S. PATENT DOCUMENTS 4,904,153 * 2/1990 Iwasawa et al. ..................... 414/735
4,923,352 * 5/1990 Tamura et al. ....................... 414/225
5,464,475 * 11/1995 Sikes et al. ............................ 118/19
6,135,698 * 10/2000 Bonora et al. ....................... 414/416

FOREIGN PATENT DOCUMENTS 10-230855   9/1998   (JP) .

* cited by examiner

Primary Examiner—Harold Joyce
Assistant Examiner—Derek S. Boles
(74) Attorney, Agent, or Firm—Arent Fox Kintner Plotkin & Kahn, PLLC

(57) ABSTRACT

A work conveying and transferring apparatus has a trolley having a casing defining a hermetically sealed space, and a support portion provided on the trolley for placing at least one container containing a cassette carrying works. A container opening device is provided on the trolley to open the container placed on the support portion, and a cassette transferring device is provided for transferring the cassette from the trolley to a treating apparatus, with the container placed on the support portion opened. The support portion is provided in the sealed space, and works can be double sealed by the sealed space and the container.

10 Claims, 31 Drawing Sheets

| JUDGE PATTERN | 1 | 2 | 3 | 4 |
|---|---|---|---|---|
| A | ○ | | | |
| B | ○ | ○ | | |
| C | ○ | ○ | ○ | |
| D | ○ | ○ | ○ | ○ |
| E | ○ | ○ | | ○ |
| F | ○ | | ○ | ○ |
| H | | ○ | ○ | ○ |

DOUBLE-SEALED WORK CONVEYING AND TRANSFERRING APPARATUS AND CONTAINER INSPECTING METHOD

BACKGROUND OF THE INVENTION

1. Field of the Invention

The present invention relates to an apparatus for conveying and transferring workpieces such as semiconductor wafers, liquid crystal substrates, optical disks and magnetic disks or the like, a method of inspecting conveying containers, and a method of treating works and containers.

2. Description of the Related Art

Semiconductor wafers or liquid crystal substrates (hereinafter referred to as works) are accommodated in and supported by a cassette having grooves for inserting the works therein, and the cassette carrying the works is loaded into a treating apparatus or an inspection apparatus (hereinafter referred to as a treating apparatus) in a manufacturing process. The cassette carrying the works is conveyed, manually or by a trolley, from a treating apparatus to another treating apparatus. The trolley may be pushed by hand or may be electrically powered. The cassette carrying the works is set in the treating apparatus where the works are treated.

In a plant for manufacturing semiconductor devices and liquid crystal panels, the process is carried out in an atmosphere called a clean room containing an extremely small amount of foreign matter (particles) which are liable to cause defects to the products. Not only foreign matter but also gaseous molecules could contaminate the works to cause defects in the products. Further, dust from the conveying trolley and a human body becomes a cause of contamination of the works. As the works are treated very finely, the cleanliness of the clean room must be maintained very high, often making it necessary to reconstruct a clean room. Hence, costs for maintenance and management of the clean room and for reconstructing clean rooms are increasing.

In order to prevent contamination to the works caused while the works are being conveyed, there has been proposed an SMIF (standard machine interface) system. The SMIF system uses a standardized closed container called POD or FOUP (front opening unified pod) and a loading device adapted to the closed container. A cassette carrying the works is contained in a clean sealed container (POD), so that the works can be conveyed or can be placed outside the treating apparatus, without being contaminated.

The loading device is arranged by the side of the treating apparatus or is incorporated in the treating apparatus. The loading device has a support portion for placing the closed container outside the treating apparatus. The closed container containing the cassette carrying the works is conveyed to the support portion of the loading device in a desired treating apparatus by passing through an area where cleanliness is relatively low, and is placed on the support portion.

The loading device is an interface device between an area where cleanliness is relatively low and the interior in the processing apparatus in which high cleanliness is maintained. The loading device includes a container opening means for opening the closed container on the support portion, and a cassette transferring means for transferring the cassette from the container that is opened onto the treating apparatus. Therefore, the works, with the cassette, are fed into the treating apparatus, works are taken out from the cassette one by one or several ones together, by a robot, or all the works are transferred at once, and the works are treated. After the works are treated in the treating apparatus or are inspected, the works are returned back to the cassette again, and the cassette is transferred onto the support portion of the loading device. The cassette transferred onto the support portion of the loading device is contained in the closable container.

It is necessary to prepare and use standardized closed containers and loading devices adapted thereto, if the SMIF system is to be used. However, the standardized closed container is relatively expensive. It is desired to convey works using a container other than the standardized closed container. Further, a loading apparatus must be provided for each treating apparatus. Therefore, a plurality of treating apparatus require an equal number of the loading devices. Accordingly, the SMIF system becomes relatively expensive.

In addition, when works are to be conveyed using a trolley, it is desired that the trolley is provided with an air cleaning device to maintain the interior of the trolley clean. The air cleaning device usually includes a fan operated by electric power and a filter. A storage battery is mounted on the trolley to supply electric power to the fan on the trolley. However, the storage battery is so heavy that the weight of the trolley increases. Besides, a problem arises concerning handling the battery, such as an operation for electrically charging the battery. It is therefore desired to provide a trolley that is free from the above-mentioned problems yet capable of keeping the works clean. It is further desired to provide a work conveying and transferring apparatus using a trolley capable of decreasing the adhesion of particles on the works such a semiconductor wafers or liquid crystal substrates.

Further, the closed container has a base portion, a cover portion mounted on the base portion, and a locking means for locking the cover portion to the base portion. The loading device has an unlocking means for unlocking the locking means. As the closed container is used many times, the locking means of the closed container becomes damaged, the function of the locking means is deteriorated, and the members constituting the locking means are worn out and produce play.

So far, therefore, the closed container is replaced by a new one after the container is used for a predetermined period of time or is used for a predetermined number of uses. In many cases, therefore, closed containers that can be still used are often discarded, resulting in an increase in the cost. Further, the closed containers are often continuously used even after the function of its locking means has been deteriorated, causing a problem. It has therefore been demanded to inspect the closed container.

Also, when the interior of the closed container is contaminated, the container is disassembled to wash the parts. This, however, requires laborious work for disassembling and washing. It is desired to clean the closed container of the contamination without much labor. It is also desired to inspect the closed container and to clean it of the contamination in combination with the step for treating the works.

The invention is further concerned with a conveying apparatus adapted to conveying a carrier containing substrates such as semiconductor substrates.

In a process for producing semiconductor devices, the semiconductor substrates are contained in the carrier which is conveyed between, for example, two semiconductor treating apparatuses or between a stocker and the semiconductor treating apparatus. The conveying apparatus includes a conveying trolley that runs along a floor or a ceiling. The carrier containing the substrates is accommodated in a closed box which is mounted on the conveying trolley, so that the substrates will not be contaminated while being conveyed.

The closed box is lifted from, for example, the stocker and is lowered at a semiconductor treating portion. For this purpose, therefore, the conveying apparatus includes an elevator. The elevator is a hoist including, for example, a motor and a plurality of wires (or belts). The plurality of wires are attached to the closed box. Upon simultaneously winding the plurality of wires, the closed box can be elevated and lowered maintaining a horizontal attitude.

In the conventional conveying apparatus in which the carrier containing the substrates is further accommodated in the closed box, a plurality of closed boxes are required in a number equal to the number of the carriers. The closed box is expensive and is larger than the carrier. When being not used, therefore, a large space is required for storing the closed boxes.

It has therefore been desired to mount the carrier containing the substrates on the conveying trolley without using the closed box. However, since the carrier is not of a closed structure, a problem arises in that dust adheres on the substrates while being conveyed. When the carrier is conveyed by the conveying trolley, further, the substrates contained in the carrier move and vibrate, and escape from the carrier and may fall from the conveying trolley.

In elevating and lowering the substrates contained in the closed box or the carrier, there is a problem that it is difficult to elevate or lower the box or the carrier maintaining a horizontal attitude, if there is any difference in the elongation of the wires of the elevator. When the closed box or the carrier is not elevated or lowered maintaining a horizontal attitude, the box or the carrier is not lowered onto a correct position, producing a transferring miss. Therefore, the lengths of the wires must be often adjusted.

SUMMARY OF THE INVENTION

The object of the present invention is to provide a work conveying and transferring apparatus capable of conveying works in a clean condition and transferring the works into a treating apparatus in a clean condition.

Another object of the present invention is to provide a method of inspecting a container containing works.

A further object of the present invention is to provide a method of treating works and a container.

A still further object of the present invention is to provide a conveying apparatus capable of safely and economically conveying substrates in a state of being contained in a carrier, contributing to efficiently producing products.

A yet further object of the present invention is to provide a conveying apparatus which uses an elevator having a plurality of wires and enables articles to be elevated and lowered by the wires while maintaining a horizontal attitude.

A work conveying and transferring apparatus according to the present invention comprises a trolley having a housing defining a substantially hermetically sealed space and having an opening and closing window, a support portion provided in the housing of the trolley for placing at least one container containing a cassette carrying works, a container opening device provided on said trolley to open said container placed in the support portion, and a cassette transferring device provided in the trolley for transferring the cassette from the trolley to a treating apparatus with container placed on the container support portion opened and for transferring the cassette from the treating apparatus to the trolley, wherein the works are double sealed by the housing and by the container.

In this constitution, the trolley can convey the container containing the cassette carrying the works. The works are conveyed double-sealed by the sealed housing and the container. The trolley is equipped with the container opening device and the cassette transferring device, and the cassette carrying the works is transferred from the trolley to the interior of the treating apparatus and from the interior of the treating apparatus to the trolley. In this work conveying and transferring apparatus, the container is not necessarily a standardized one, and a single trolley can be used for a plurality of treating apparatuses.

The invention further provides a method of inspecting a container having a base portion, a cover portion mounted on the base portion and a locking device for locking the cover portion to the base portion, the container being adapted to contain works, the method comprising the steps of hermetically maintaining a gas in the container under pressure and measuring a force applied to the cover portion to inspect a function of the locking device.

In this constitution, the container for containing works can be conveniently inspected.

The invention further provides a method of treating works and a container, the container having a base portion, a cover portion mounted on the base portion and a locking device for locking the cover portion to the base portion, the method comprising the steps of hermetically maintaining a gas in the container containing works under pressure, measuring a force exerted on the cover portion to inspect a function of the locking device, and taking works from the container and transferring them into a treating apparatus.

In this constitution, the container for containing the works is easily inspected while the container is actually used for the manufacturing process.

According to another aspect of the present invention, a conveying apparatus comprises a trolley, a grip member elevatably supported by the trolley, a cover provided in the grip member and having an open lower end, a mounting device provided in the grip member for securing a carrier containing substrates in the cover, and a substrate movement preventing mechanism to prevent the substrates from moving out of the carrier mounted on the mounting device.

According to this constitution, the cover having the open lower end is provided. Therefore, the substrates are not exposed to the outer side of the cover and are not contaminated. Besides, the substrate movement preventing mechanism prevents the substrates from moving out of the carrier. Even without using the closed box, therefore, it is possible to mount the carrier containing the substrates in the conveyer trolley.

According to a further aspect, the present invention provides a conveying apparatus comprising a trolley and a member supported by the trolley via an elevator device, the elevator device comprising a plurality of wires, a motor, and a wire winding mechanism which transmits the driving force of the motor to the wires and causes the winding speed to change depending upon the winding torques of the wires.

According to this constitution, the article is elevated and lowered by the elevator device maintaining a horizontal attitude, and is brought to a correct position.

BRIEF DESCRIPTION OF THE DRAWINGS

The present invention will become more apparent from the following description of the preferred embodiments after reference to the accompanying drawings in which.

DESCRIPTION OF THE PREFERRED EMBODIMENTS

Figure 1:
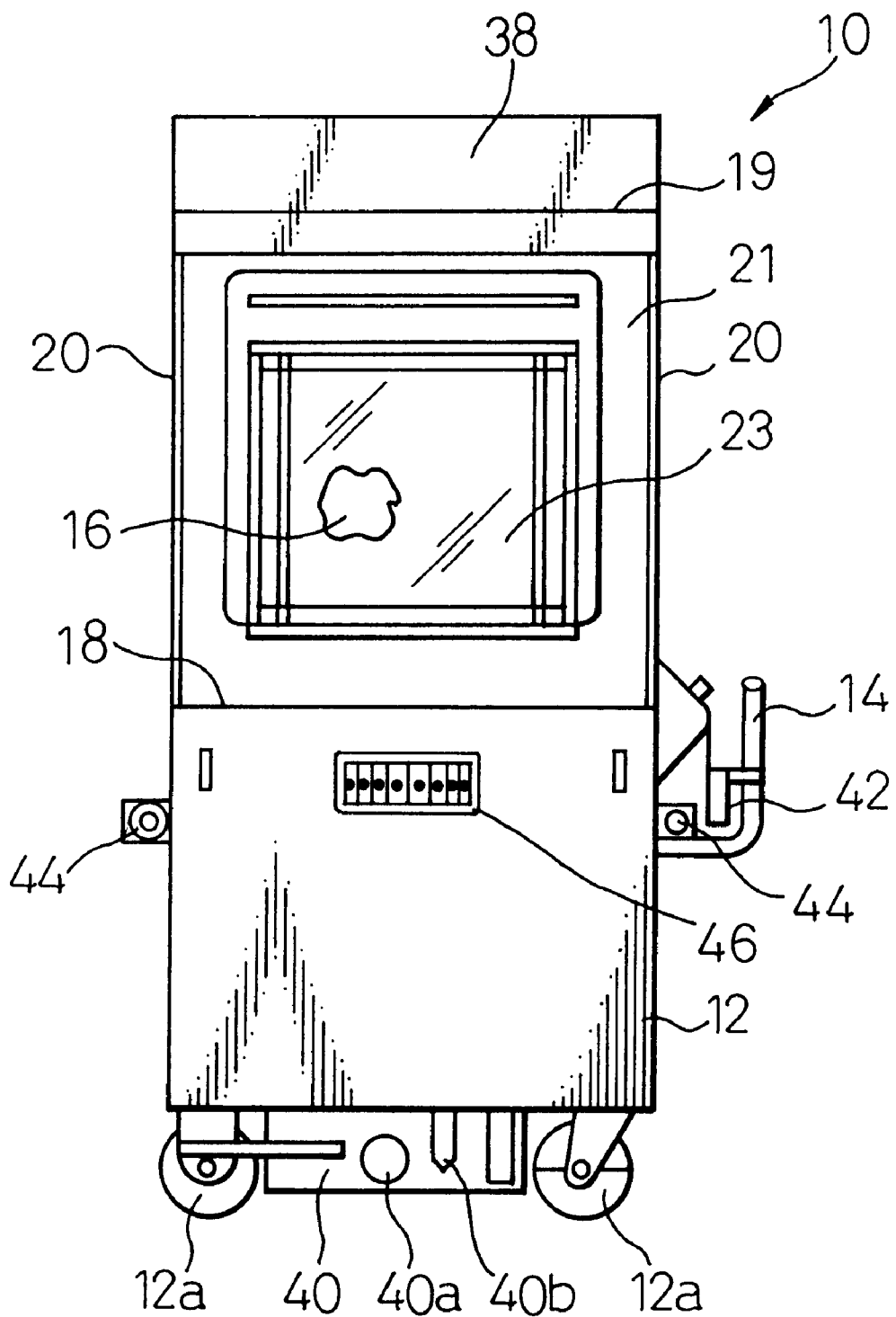
FIG. 1 is a front view illustrating a work conveying and transferring apparatus according to the first embodiment of the present invention.
Figure 2:
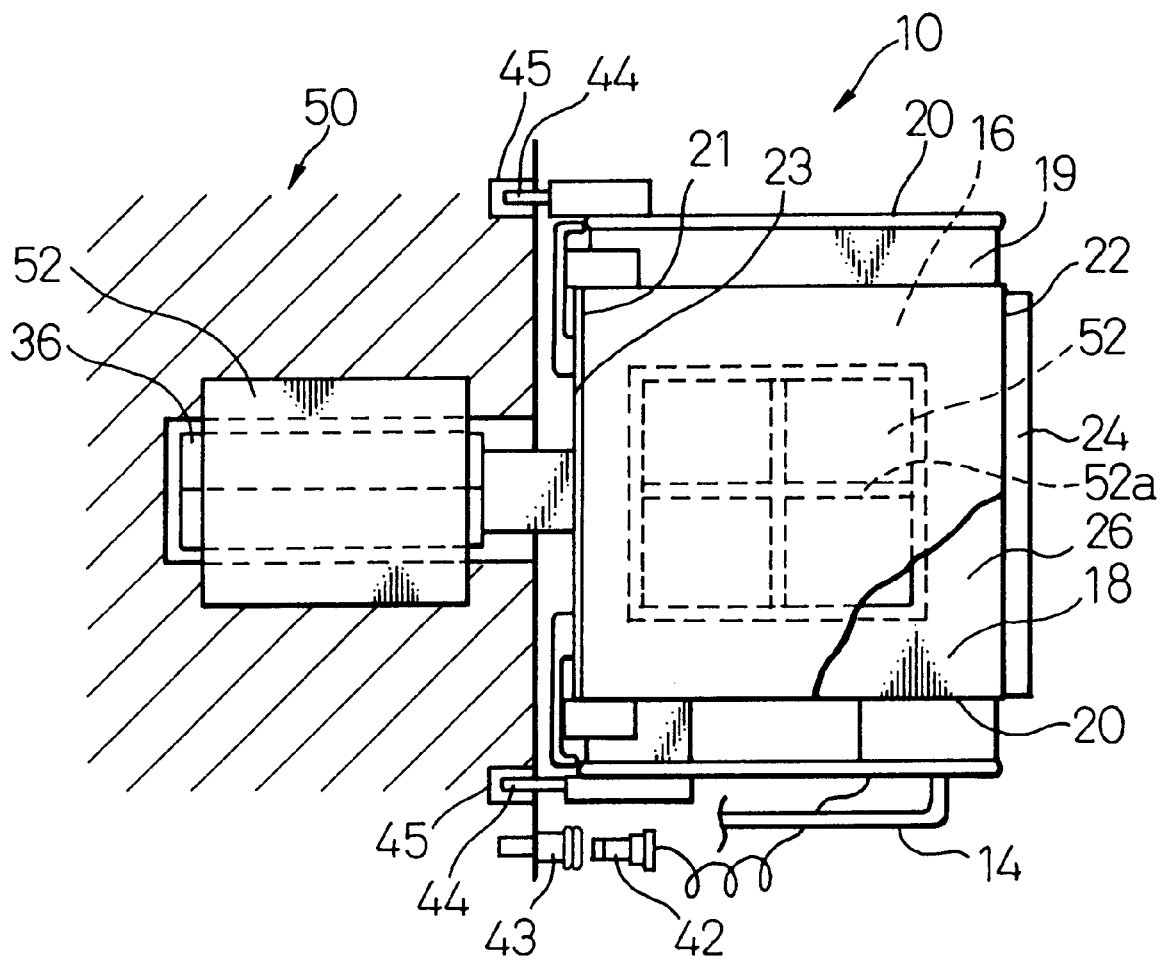
FIG. 2 is a plan view of the work conveying and transferring apparatus of FIG. 1.
Figure 3:
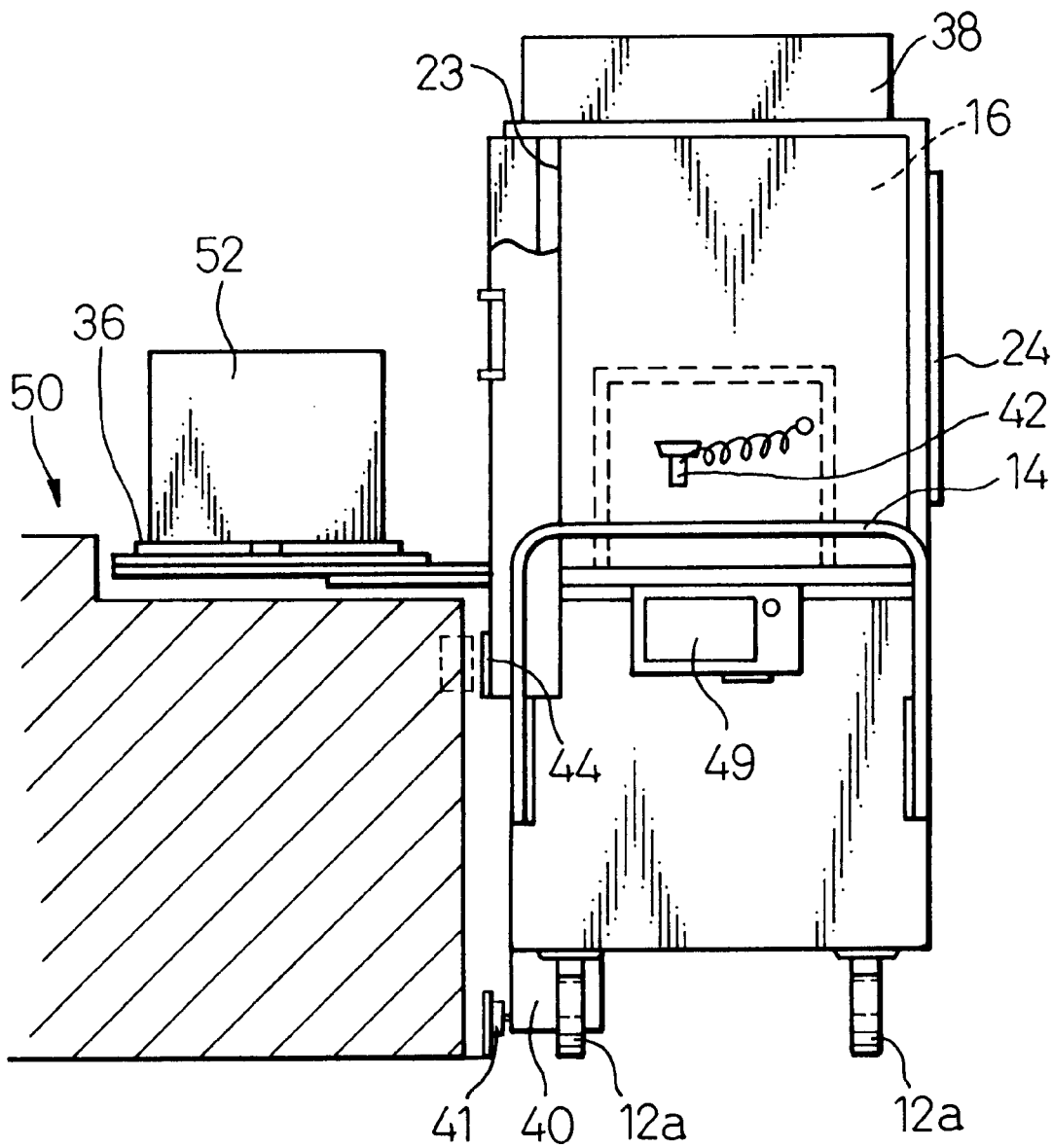
FIG. 3 is a side view of the work conveying and transferring apparatus of FIG. 1.
Figure 4:
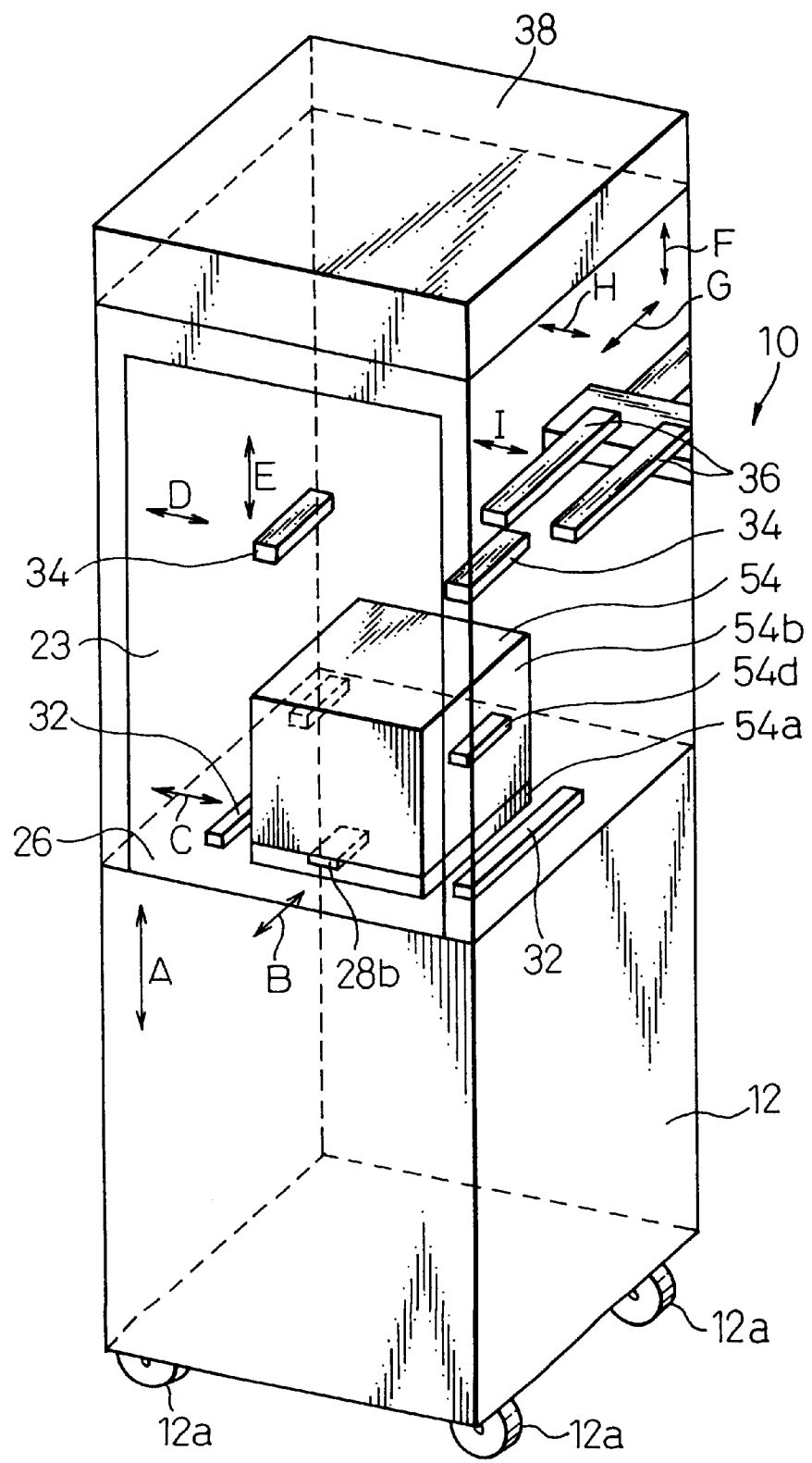
FIG. 4 is a perspective view of the work conveying and transferring apparatus of FIGS. 1 to 3, for explaining the function thereof.

FIGS. 1 to 4 are views illustrating the work conveying and transferring apparatus 10 according to the first embodiment of the present invention. FIG. 1 is a front view of the work conveying and transferring device 10, FIG. 2 is a plan view of the work conveying and transferring apparatus, FIG. 3 is a side view of the work conveying and transferring apparatus 10, and FIG. 4 is a view schematically illustrating a trolley 12 to explain the function of the work conveying and transferring apparatus 10 omitting several members.

The work conveying and transferring apparatus 10 comprises a trolley 12 having wheels 12a. In this embodiment, the trolley 12 has a handle 14, so that the operator can grip the handle 14 and push the trolley 12. The trolley 12 is adapted to convey works such as semiconductor wafers or liquid crystal substrates, and transfer the works from the trolley 12 to the interior of a treating apparatus 50. Or, the trolley 12 transfers the works from the interior of the treating apparatus 50 to the trolley 12. The treating apparatus 50 is one of treating apparatuses and inspection apparatuses in a process for manufacturing the works such as semiconductor wafers or liquid crystal substrates.

The trolley 12 has a front, which is the side of the trolley 12 facing the treating apparatus 50 when the trolley 12 is located in front of the treating apparatus 50. In FIGS. 2 and 3, the left side of the trolley 12 is the front of the trolley 12. FIG. 1 shows the front of the trolley 12. A front window 23 is provided in the front of the trolley 12 so that the works can be inserted into and taken out of the trolley 10.

The treating apparatus 50 has an inlet/exit for the works. An air cleaning device (not shown) including a fan and a filter is disposed in the treating apparatus 50 neighboring the work inlet/exit. The interior of the treating apparatus 50 is maintained very clean, and the cleanliness of the outer side of the treating apparatus 50 is lower than that inside the treating apparatus 50. The trolley 12 conveys the works into the treating apparatus 50 while maintaining the works clean, so that the works will not be contaminated even in the regions where the degree of cleanliness is relatively low.

In FIGS. 1 to 4, the trolley 12 has a housing defining a substantially hermetically sealed space 16. The sealed space 16 is defined by a bottom wall 18, a ceiling wall 19, both side walls 20, a front wall 21 and a rear wall 22. The front window 23 is formed in the front wall 21. A rear window 24 is formed in the rear wall 22. Usually, the front window 23 is opened so that the works can be transferred between the trolley 12 and the treating apparatus 50. It is, however, also allowable to open the rear window 24.

The trolley 12 has a support portion 26 for placing at least one container containing a cassette carrying works in the sealed space 16. In this embodiment, the support portion 26 is formed by the bottom wall 18. However, the support portion 26 may be formed by any other member secured to the bottom wall 18. FIG. 4 best shows the support portion 26 for placing the container 54. The front window 23 and the rear window 24 can be opened and closed in a sliding manner in the direction indicted by the arrow A in FIG. 4.

Figures 6, 7:
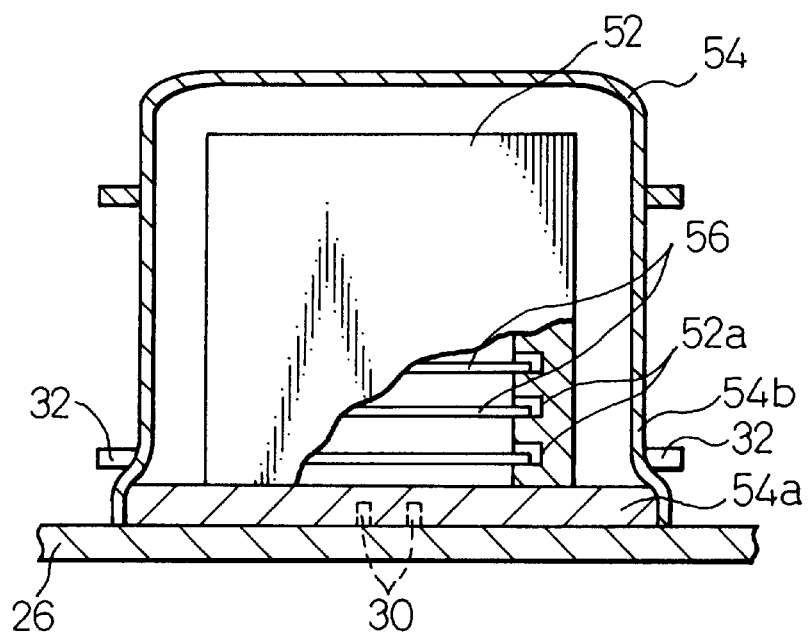
FIG. 6 is a view illustrating an example of signal judge patterns.
FIG. 7 is a view illustrating a cassette and a container.

FIG. 7 is a view illustrating an example of the cassette 52 and the container 54. The cassette 52 has a plurality of grooves 52a extending in parallel, and a plurality of works 56 are inserted in the grooves 52a in the cassette 52 and are thus carried by the cassette 52. The substrates of, for example, semiconductor wafers or liquid crystal panels are thus supported in the cassette 52, and are conveyed from a treating apparatus to another treating apparatus. The container 54 comprises a base portion 54a and a cover portion 54b mounted on the base portion 54a. The cassette 52 carrying the works 56 is contained in the container 54. The container 54 containing the cassette 52 is placed on the support portion 26 of the trolley 12, as shown in FIG. 4.

Figure 8:
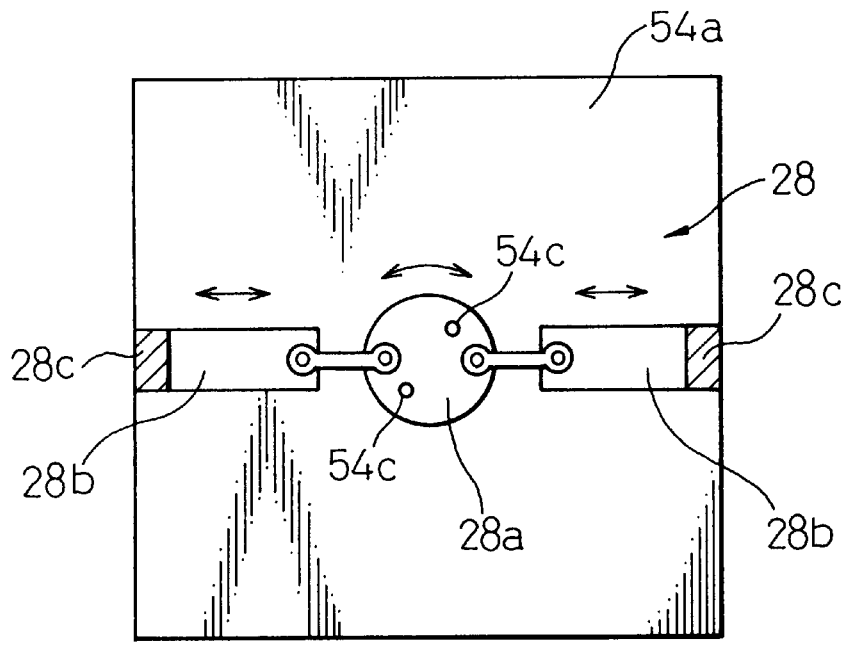
FIG. 8 is a view illustrating a mechanism for locking the closed container.

FIG. 8 is a schematic view illustrating a locking device 28 for locking the cover portion 54b to the base portion 54a. The base portion 54a has a disk 28a rotatably arranged in the base portion 54a, and latch members 28b arranged in the base portion 54a so as to move reciprocally. The latch members 28b are pivotally connected to the disk 28a. When the disk 28a is turned in the directions of the arrow, the latch members 28b reciprocally move as indicated by the arrow. Latch grooves 28c are formed in the peripheral region of the cover portion 54b. The latch members 28b engage in the latch grooves 28c in the cover portion 54b. The disk 28a also has unlocking holes 54c.

An unlocking device is disposed in the support portion 26 of the trolley 12. The unlocking device includes an actuator that is not shown and unlocking pins shown in FIG. 7. The unlocking pins 30 are inserted in the unlocking holes 54c in the disk 28c. Therefore, the disk 28a is turned by the unlocking device including the unlocking pins 30. In FIG. 8, the locking device 28 is in the locking position. When the disk 28a is turned either clockwise or counterclockwise as indicated by the arrow, the latch members 28b move reciprocally to escape from the latch grooves 28c. Therefore, the locking device 28 is unlocked, permitting the cover portion 54b to be lifted up from the base portion 54a. The latch member 28b is shown in FIG. 4 and moves in the direction indicated by the arrow B in FIG. 4.

In FIG. 4, container fixing members 32 are provided on the support portion 26 of the trolley 12. The container fixing members 32 can be moved in the direction indicated by the arrow C in FIG. 4, and act to fix the container 54 to the support portion 26 of the trolley 12 so that the container 54 will not move while the trolley 12 is traveling. The container fixing members 32 may be brought into engagement with either the cover portion 54b or the base portion 54a of the container 54.

Container opening members 34 are provided for opening the container 54. The container opening members 34 can be moved in the directions of arrows D and E, and are brought into engagement with protrusions 54d on the cover portion 54b of the container 54. The container opening members 34 are operated after the unlocking pins have unlocked the locking device 28 (after the container fixing members 32 are unlocked when the container fixing members 32 are engaged with the cover portion 54b of the container 54), and act to lift the cover portion 54b of the container 54 with respect to the base portion 54a. Therefore, the container 54 is opened, and the cassette 54 (FIG. 7) contained in the container 54 is exposed.

Cassette transferring arms 36 are provided for transferring the cassette 52 between the trolley 12 and the treating apparatus 50. The cassette transferring arms 36 comprise a pair of fork-like blades. The cassette transferring arms 36 are allowed to move in three directions at right angles with one another as indicated by arrows F, G and H. The cassette transferring arms 36 are further allowed to move in the direction indicated by the arrow I to open and close the fork-like blades.

FIGS. 2 and 3 illustrate a state where the cassette transferring arms 36 are transferring the cassette 52 from the trolley 12 to the treating apparatus 50. In this operation, the cassette transferring arms 36 are operated in the direction of arrow F to raise the cassette 52 to an upper position, operated in the direction of arrow H to move to a position in alignment with the cassette 52, operated in the direction of arrow G to move to a position just above the cassette 52, operated in the direction of arrow I so that the pair of fork-like blades are opened wider than the width of the cassette 52, operated in the direction of arrow F to descend to a position of the bottom of the cassette 52, operated in the direction of arrow I so that the pair of fork-like blades are closed narrower than the width of the cassette 52, operated in the direction of arrow F to lift up the cassette 52, and operated in the direction of arrow G to carry the cassette 52 to the treating apparatus 50. The constitution and operation of the cassette transferring arms 36 are not limited to the above-mentioned example, as a matter of course. The cassette transferring arms 36 and the cassette 52 are so shaped that the cassette transferring arms 36 can be easily inserted between the base portion 54a of the container 54 and the bottom of the cassette 52 so as to lift the cassette 52. For example, the bottom of the cassette 52 has a rib, and the fork-like blades are positioned on both sides of the rib. Or, the upper part of the cassette may be constituted by a protruded plate to be handled.

The trolley 12 is further equipped with an air cleaning device 38 for feeding the clean air into the sealed space 16. The air cleaning device 38 is provided on the ceiling wall 19 and includes an electric fan and a filter. In a state where the front window 23 and the rear window 24 are closed, therefore, the sealed space 16 maintains the environment more clean than the environment in which the trolley 12 is disposed. In addition, the works 56 are contained in the sealed container 54. Therefore, the works 56 are double sealed by the sealed space 16 and the container 54.

Figure 9:
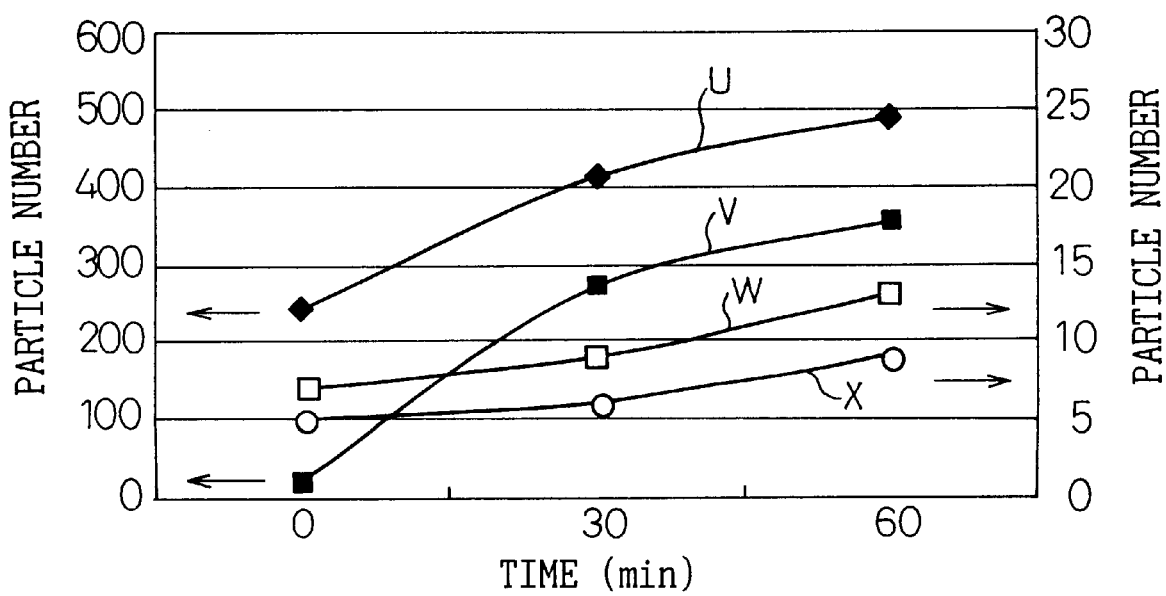
FIG. 9 is a diagram illustrating the results of test of cleanliness of the works.

FIG. 9 is a diagram illustrating the results of the test of cleanliness of the works 56, and wherein the ordinate represents the number of particles of a size of not smaller than 0.1 μm adhered on the works 56 and the abscissa represents the time. The curve U represents the number of particles adhered onto the work 56 when the work 56 are left to be exposed outside the trolley 12 in a clean room of a class 1000, and the curve V represents the number of particles adhered onto the works 56 when the works 56 are left to be exposed inside the trolley 12 in the same clean room. When the work 56 is placed inside the trolley 12, the particles first adhere in a small number. However, the number of particles adhered increases with the passage of time. The curve W represents the number of particles adhered onto the works 56 when the works 56 are contained in the container 54 outside the trolley 12 in the same clean room. The number of particles adhered becomes very small when the work 56 is contained in the container 54. The curve X represents the number of particles adhered onto the works 56 when the works 56 are contained in the container 54 inside the trolley 12 in the same clean room. The number of particles adhered becomes very small when the work 56 is placed inside the trolley 12 being contained in the container 54. It is therefore very desirable to double seal the work 56 using the sealed space 16 and the container 54. Accordingly, the works 56 are maintained clean even when the container 54 is not so highly sealed.

The fan of the air cleaning device 38 is driven by electric power. The trolley 12 does not carry any power source such as a storage battery, and the electric power is supplied at the treating apparatus 50. The trolley 12 has a power source positioning unit 40 (FIG. 1) at a central position of the front bottom thereof. The power source positioning unit 40 has a connector member 40a and a first positioning member 40b. The treating apparatus 50 has a power source positioning unit 41 (FIG. 3) corresponding to the power source positioning unit 40. It will be apparent that the power source positioning unit 41 has a connector member corresponding to the connector member 40a and a first positioning member corresponding to the first positioning member 40b.

Figure 21:
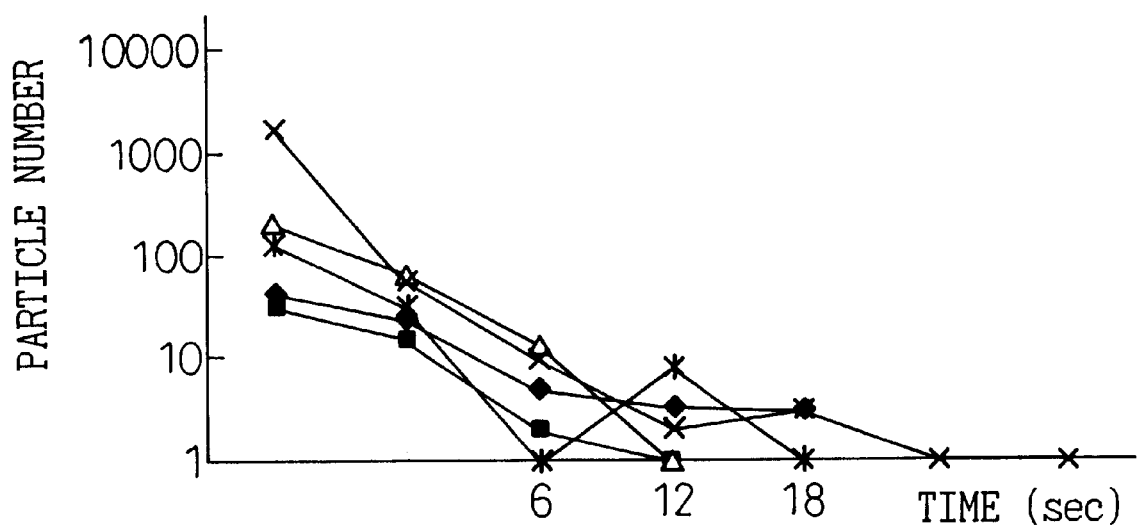
FIG. 21 is a diagram illustrating the degree of cleanliness in the space in the trolley after the fan of the air cleaning device is started.

When the trolley 12 comes in front of the treating apparatus 50, the power source positioning unit 40 of the trolley 12 is connected to the power source positioning unit 41 of the treating apparatus 50. In this case, the first positioning member 40b is fitted in the corresponding positioning member of the power source positioning unit 41, so the trolley 12 is mechanically positioned relative to the treating apparatus 50. At the same time, the connector member 40a of the trolley 12 is connected to the connector member of the power source positioning unit 41 of the treating apparatus 50, and the fan of the air cleaning device 38 can be driven by electric power. FIG. 21 is a diagram illustrating the cleanliness in the space 16 after the fan of the air cleaning device 38 is driven. After about 12 seconds from the start of the fan, the space 16 becomes sufficiently clean, and the works 56 are not contaminated even when the container 54 is opened. The particle number is the number of particles having sizes of not smaller than 0.1 μm.

A current supply switch is provided in the power supply system between the air cleaning device 38 and the connector member 40a. The current supply switch is a pneumatic switch that becomes effective when the pneumatic pressure is introduced into a coupling member 42 that will be described below. The current supply switch has a double circuit function. When the coupling member 42 is coupled and the current supply switch is depressed, the fan of the clean air feeding device 38 is allowed to operate. The unlocking pins 30, container fixing members 32 and container opening members 34 can be also driven by the electric power. It is also possible to operate these members by pneumatic force.

The cassette transferring arms 36 of the trolley 12 are operated by the pneumatic force (pneumatic pressure). That is, the cassette transferring arms 36 are actuated by air cylinders instead of a motor or a feed screw. Use of the air cylinders makes it possible to decrease the weight of the drive unit of the cassette transferring arm 36. The actuating air is fed into the air cylinders of the cassette transferring arms 36 upon coupling the coupling member 42 of the trolley 12 to the coupling member 43 (FIG. 2) of the treating apparatus 50.

Two second positioning members 44 are provided on both sides of the trolley 12 at a height nearly equal to the height of the handle 14. The treating apparatus 50 is provided with corresponding positioning members 45. The second positioning members 44 are operated by the pneumatic force, and the trolley 12 is accurately positioned with respect to the treating apparatus 50 by the pneumatic force. That is, the second positioning members 44 are rod-like members moved forward by air cylinders, and the corresponding positioning members 45 have cavities for receiving the second positioning members 44.

The first positioning member 40b of the power source positioning unit 40 mechanically and preliminarily positions the trolley 12, and the second positioning member 44 accurately positions the trolley 12 by the pneumatic force. Therefore, the operator pushes the trolley 12, which does not includes a battery and is light in weight, to a position in front of the treating apparatus 50, and moves the trolley 12 so that the power source positioning unit 40 is connected to the power source positioning unit 41, and couples the coupling member 42 to the coupling member 43. The trolley 12 is thus accurately positioned and is secured relative to the treating apparatus 50, and the cassette 52 supporting the works 56 is now ready to be transferred.

It is considered that accurate positioning and secure fixing are not ensured, and positional deviation may arise, by simply setting the power source positioning units 40 and 41 together, so the second positioning member 44 having the fixing mechanism based on the air cylinder is used. This makes it possible to reliably enhance repeatability positioning and reliability of transferring connection.

Figure 5:
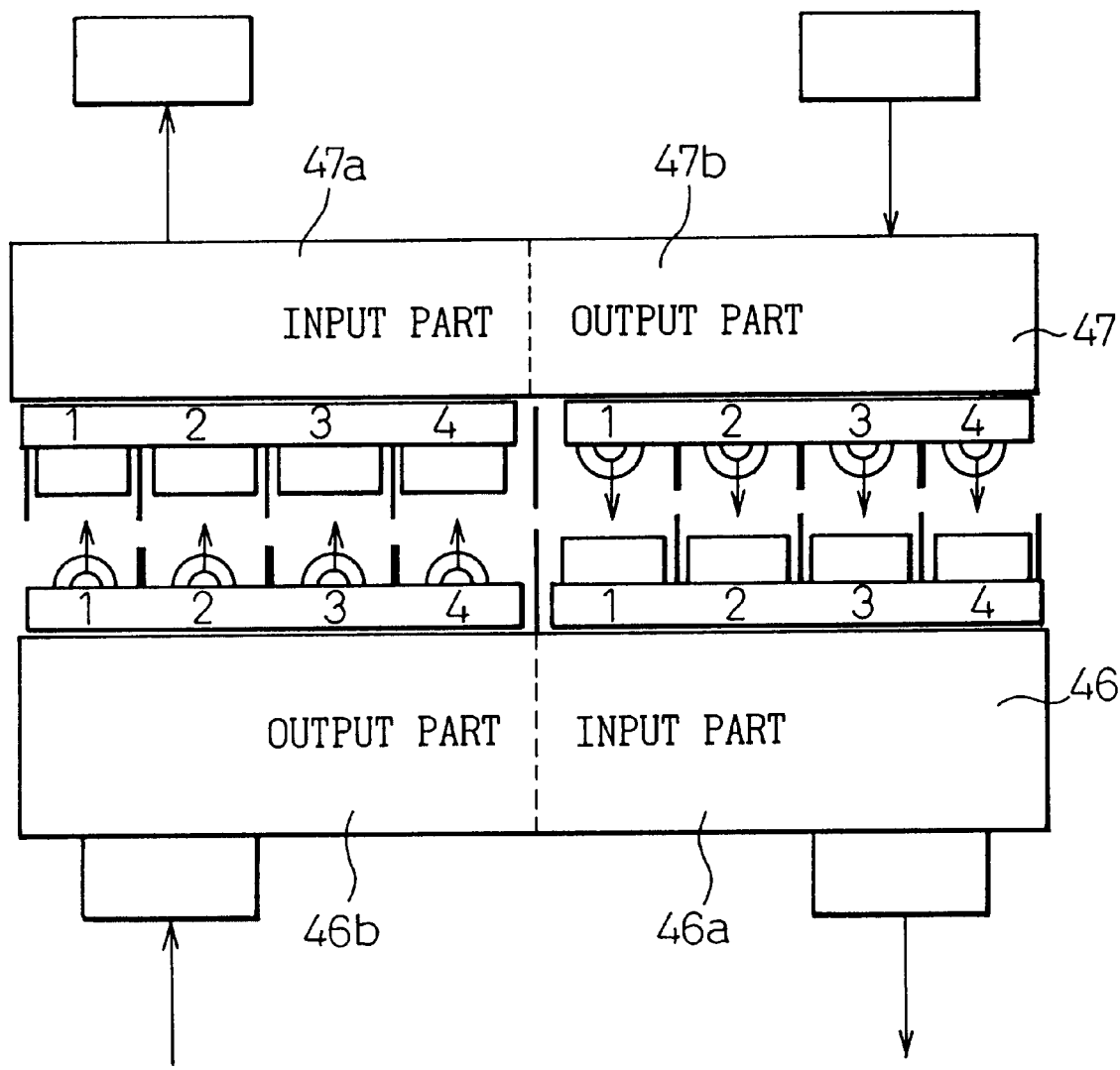
FIG. 5 is a view illustrating an interface of signals between the work conveying and transferring apparatus and a treating apparatus (manufacturing apparatus)

The trolley 12 has an operation panel 49 shown in FIG. 3. The trolley 12 further has an input/output signal unit 46 shown in FIG. 1. FIG. 5 is a view illustrating an interface of signals between the trolley 12 and the treating apparatus 50. The treating apparatus 50 has an input/output signal unit 47 in correspondence with the input/output signal unit 46 of the trolley 12. The input/output signal units 46 and 47 have input portions 46a and 47a and output portions 46b and 47b, respectively. The input portions 46a and 47a include, for example, light emitting elements, and the output portions 46b and 47b include light receiving elements. The input portion 46a and the output portion 47b, and the input portion 47a and the output portion 46b are opposed to each other when the positioning is accomplished as mentioned above. The input/output signal units 46 and 47 constitute a wireless data transfer means for transferring the data between the trolley 12 and the treating apparatus 50.

FIG. 6 illustrates an example of an interlock (interface) of the work handling between the trolley 12 and the treating apparatus 50. Judge patterns representing seven states can be transferred by using four light emitting—receiving elements. The judge pattern A represents that the positioning of the trolley 12 has been finished, and the judge pattern B represents that permission for transferring the cassette 52 is requested from the trolley 12.

By outputting and displaying the state of the opposed treating apparatus 50 such as the manufacturing apparatus or the inspection apparatus, whether it is requested to set or remove the works 56, it is possible to read the signals and to effect the automatic transfer operation on the side of the trolley. A hardware interlock based on the sensor input/output function is installed between the trolley 12 and the treating apparatus 50 to exclude manual errors in transferring the works 56. Since the communication does not rely on signal wire lines, there is no connection miss. Defective contact is avoided relying on the function for judging signals using the light emitting elements and light receiving elements.

Figure 10:
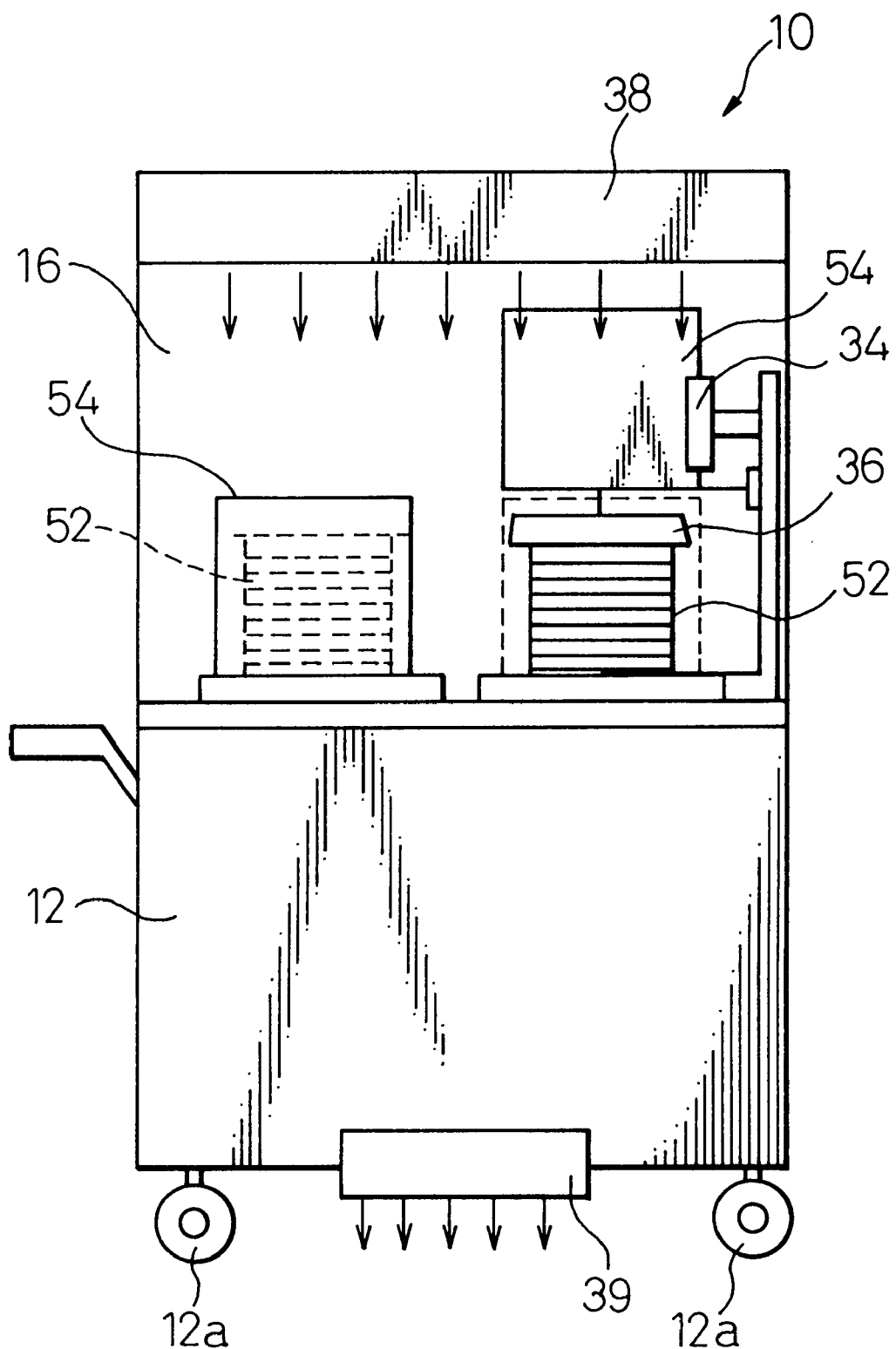
FIG. 10 is a view illustrating the work conveying and transferring apparatus according to another embodiment of the present invention.

FIG. 10 is a view illustrating the work conveying and transferring apparatus 10 according to another embodiment of the present invention. The work conveying and transferring apparatus 10 of this embodiment resembles the work conveying and transferring apparatus 10 of FIGS. 1 to 4. In the work conveying and transferring apparatus 10 of this embodiment, the support portion 26 in the sealed space 16 of the trolley 12 is capable of supporting two containers 54. The unlocking pins 30, container fixing members 32, container opening members 34 and cassette transferring arms 36 are so constituted as to engage with two containers 54 and two cassettes 52. The cassette 52 carrying the works 56 treated in the treating apparatus 50 can be transferred from the treating apparatus 50 to the trolley 12, and another cassette 52 carrying new works 56 can be transferred from the trolley 12 to the treating apparatus 50 if the trolley 12 is capable of supporting two containers 54. Therefore, the loading and the discharge of works can be continuously carried out, using a single trolley.

Figure 11:
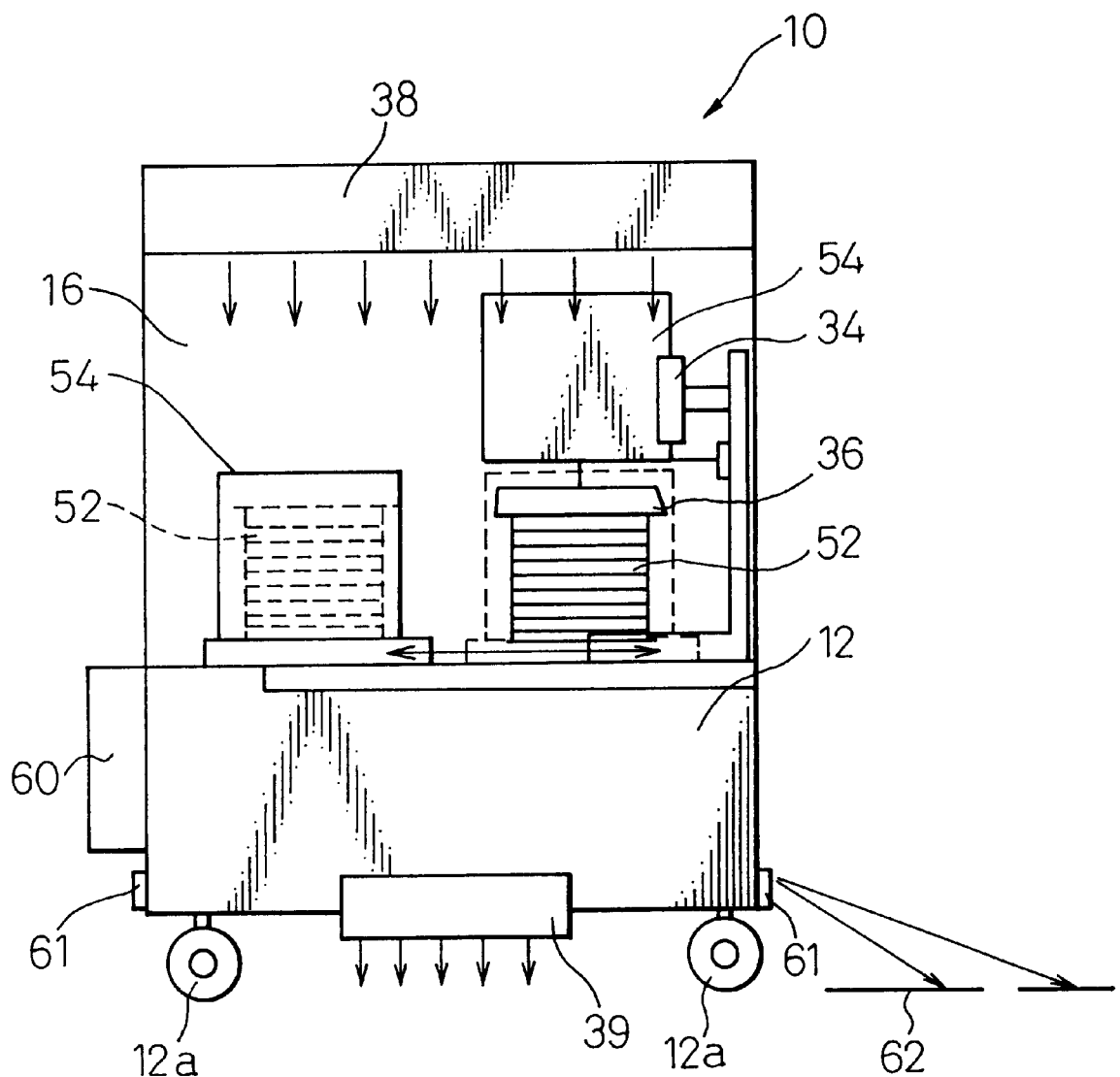
FIG. 11 is a view illustrating the work conveying and transferring apparatus according to a further embodiment of the present invention.

FIG. 11 is a view illustrating the work conveying and transferring apparatus 10 according to a further embodiment of the present invention. The work conveying and transferring apparatus 10 of this embodiment resembles the work conveying and transferring apparatus 10 of FIGS. 1 to 4. The work conveying and transferring apparatus 10 of this embodiment has a battery 60 and a sensor 61. The battery 60 feeds electric power to a motor for running the trolley 12. The sensor 61 detects travel guide markers 62 provided in the floor surface, enabling the trolley 12 to run automatically.

Figure 12:
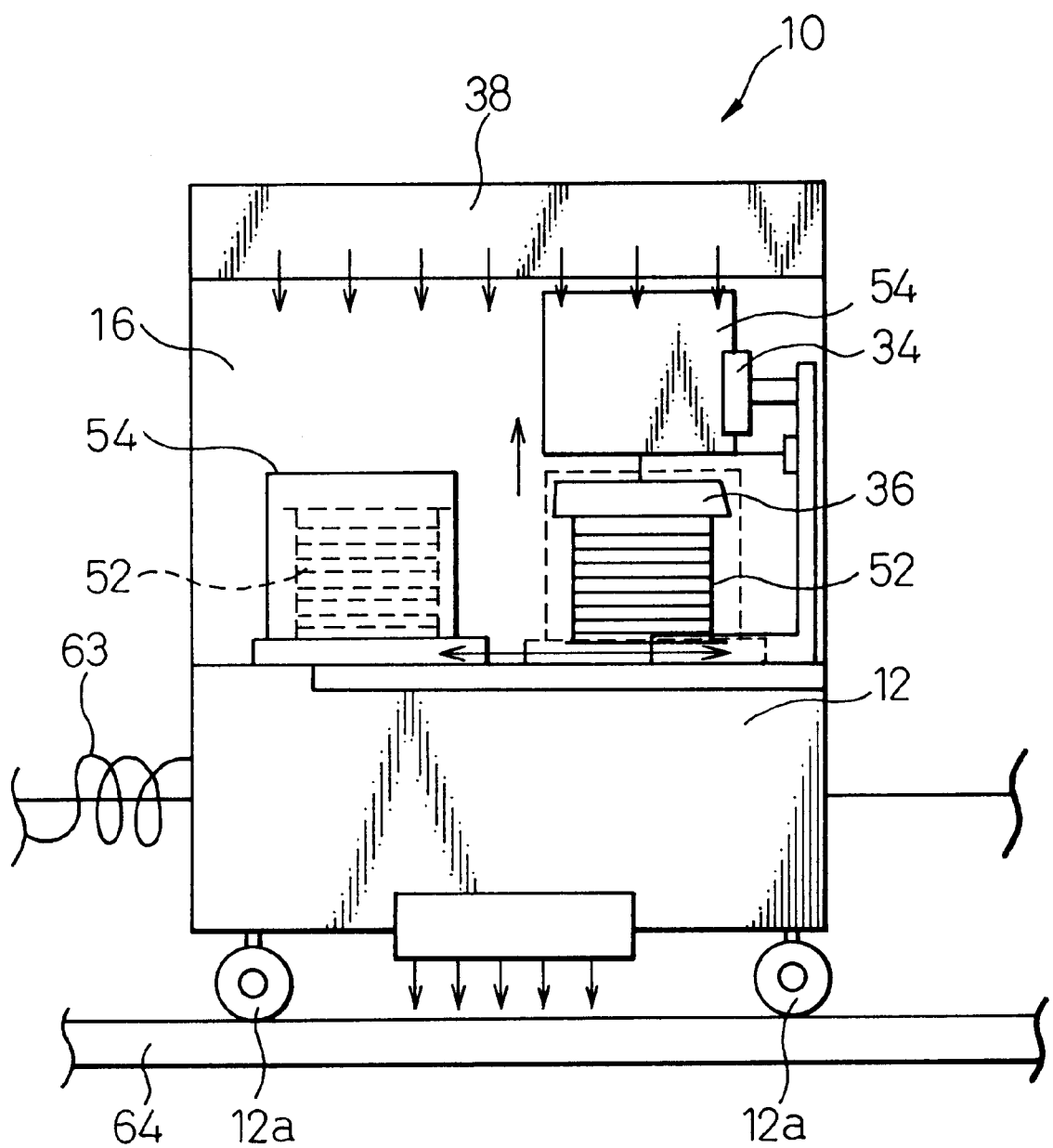
FIG. 12 is a view illustrating the work conveying and transferring apparatus according to a still further embodiment of the present invention.

FIG. 12 is a view illustrating the work conveying and transferring apparatus 10 according to a still further embodiment of the present invention. The work conveying and transferring apparatus 10 of this embodiment resembles the work conveying and transferring apparatus 10 of FIGS. 1 to 4. The work conveying and transferring apparatus 10 of this embodiment has a drive power cable 63 for feeding electric power to a motor for running the trolley 12. The trolley 12 travels along a travel guide rail 64 provided on the floor surface.

Figure 13:
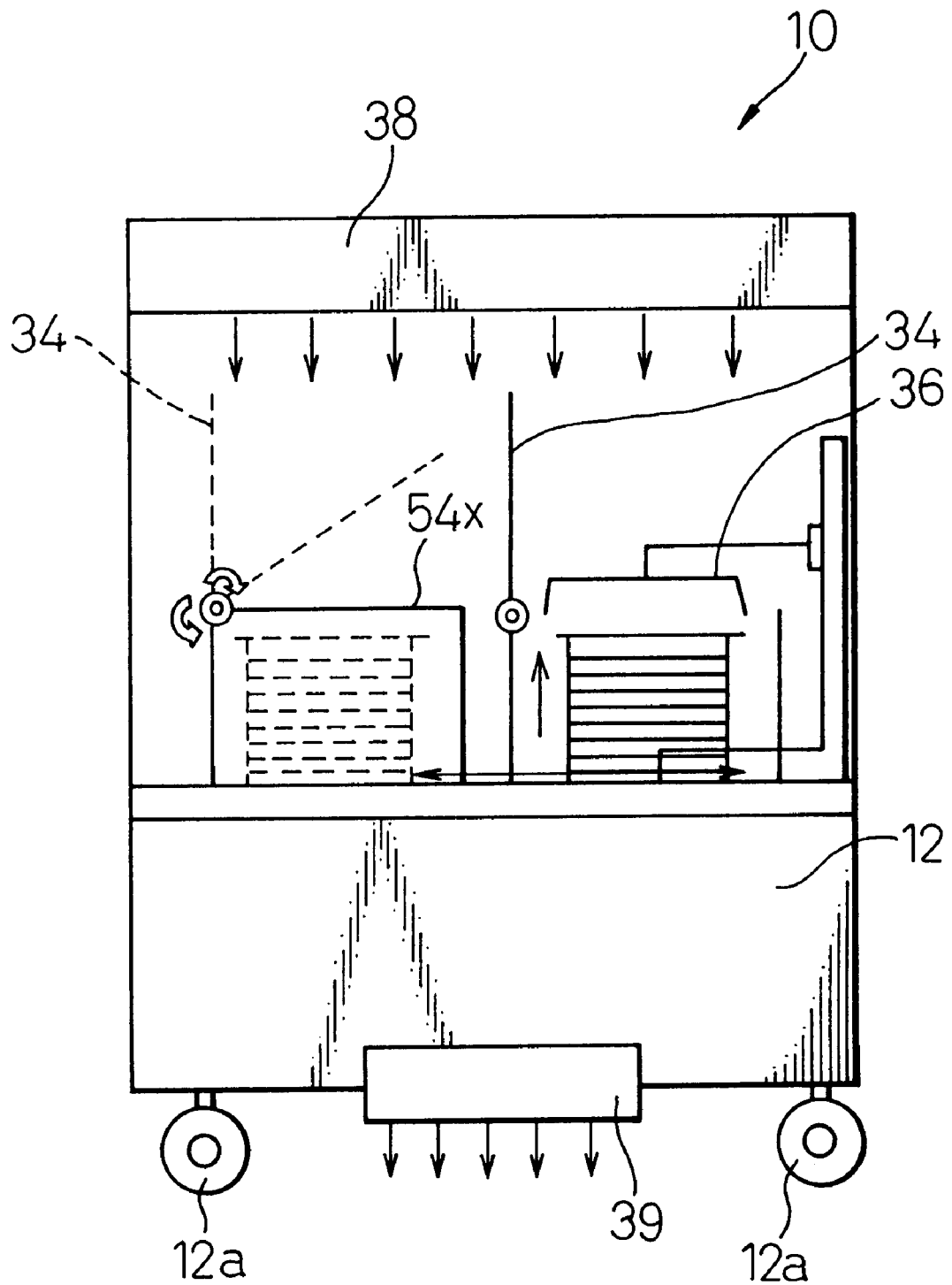
FIG. 13 is a view illustrating the work conveying and transferring apparatus according to a yet further embodiment of the present invention.

FIG. 13 is a view illustrating the work conveying and transferring apparatus 10 according to a yet further embodiment of the present invention. The work conveying and transferring apparatus 10 of this embodiment resembles the work conveying and transferring apparatus 10 of FIGS. 1 to 4. The container in this embodiment is formed in the shape of a cup-like cover 54x to cover the cassette from the upper side, while the container 54 comprises the base portion 54 and the cover portion 54b in the embodiments described above. The cup-like cover 54x contains the cassette 52 carrying the works 56, and functions to keep the works 56 clean.

In this case too, therefore, the works 56 can be double sealed by the sealed space 16 and the container 54 as explained with reference to FIG. 9. This embodiment does not need the locking device for locking the cover portion 54b to the base portion 54a and the unlocking device 30. The air cleaning device 38 is used for maintaining the space clean. The degree of cleanliness gradually decreases when the works are conveyed with the fan stopped. However, since the works 56 are double protected by being easily covered with the cup-like cover 54x, the degree of cleanliness is maintained.

Figure 14:
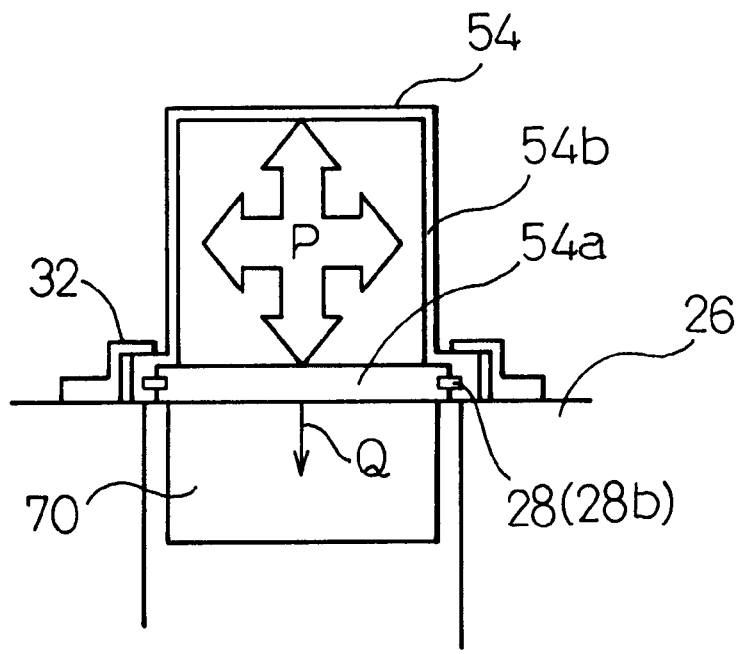
FIG. 14 is a view illustrating the embodiment of a method of inspecting a container according to the present invention.

FIG. 14 is a view illustrating the embodiment of a method of inspecting the container according to the present invention. FIG. 14 shows the same container 54 as the one shown in FIG. 7. The container 54 comprises a base portion 54a, a cover portion 54b mounted on the base portion 54a, and a locking device 28 (latching members 28b) for locking the cover portion 54b to the base portion 54a. The container 54 is placed on the support portion 26, and the container fixing members 32 hold the container 54.

This embodiment includes a means for introducing the compressed air into the container 54, and an inspection apparatus 70 which measures a force Q applied to the cover portion 54b to inspect the function of the locking device 28 (latching members 28b). A pressure P is produced in the container 54 when a gas is introduced under pressure and hermetically maintained in the container 54. Since the cover portion 54b is secured by the container fixing members 32, the force Q applied to the cover portion 54b appears as a force depressing the base portion 54a.

Figure 15:
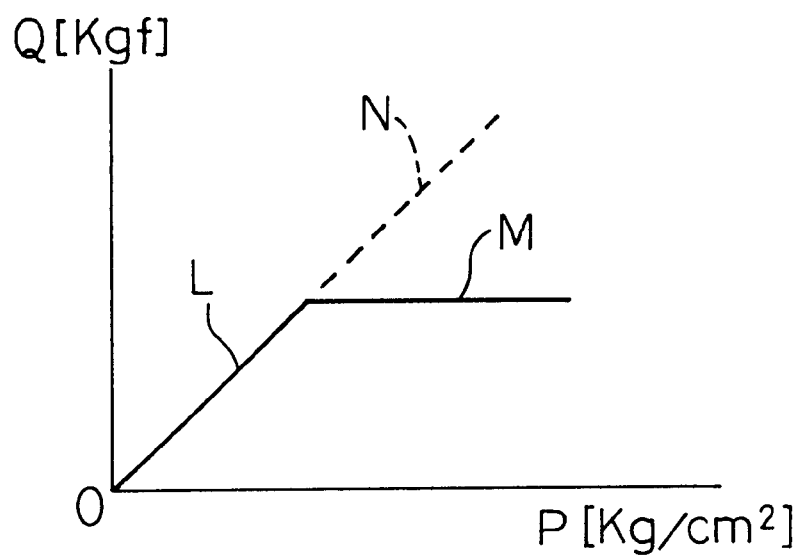
FIG. 15 is a view illustrating the relationship between the pressure of a gas and the force applied to the cover portion in the apparatus of FIG. 14.

FIG. 15 is a diagram illustrating the relationship between the pressure P and the force Q. Since wear of a some degree exists between the cover portion 54b and the base portion 54a, and the locking device 28 (latch members 28b) involves a some degree of play, the base portion 54a can move relative to the cover portion 54b at an initial stage, so the force Q varies in proportion to the pressure P, as represented by the line L. As the pressure P increases, the locking device 28 (latch members 28b) will be no longer affected by play, the base portion 54a will no longer move relative to the cover portion 54b, and the force Q becomes nearly constant, as represented by the line M.

However, if the locking device 28 (latch members 28b) involves play or other wear, the base portion 54a further continues to move relative to the cover portion 54b, and the force Q varies as represented by the straight line N with respect to the pressure P. Upon examining the relationship between the straight line M and the straight line N in advance, therefore, a measurement of the force Q applied to the cover portion 54b makes it possible to inspect the function of the locking device 28 (latching members 28b) or the degree of deterioration of the locking device 28 (latch members 28b).

Figure 16:
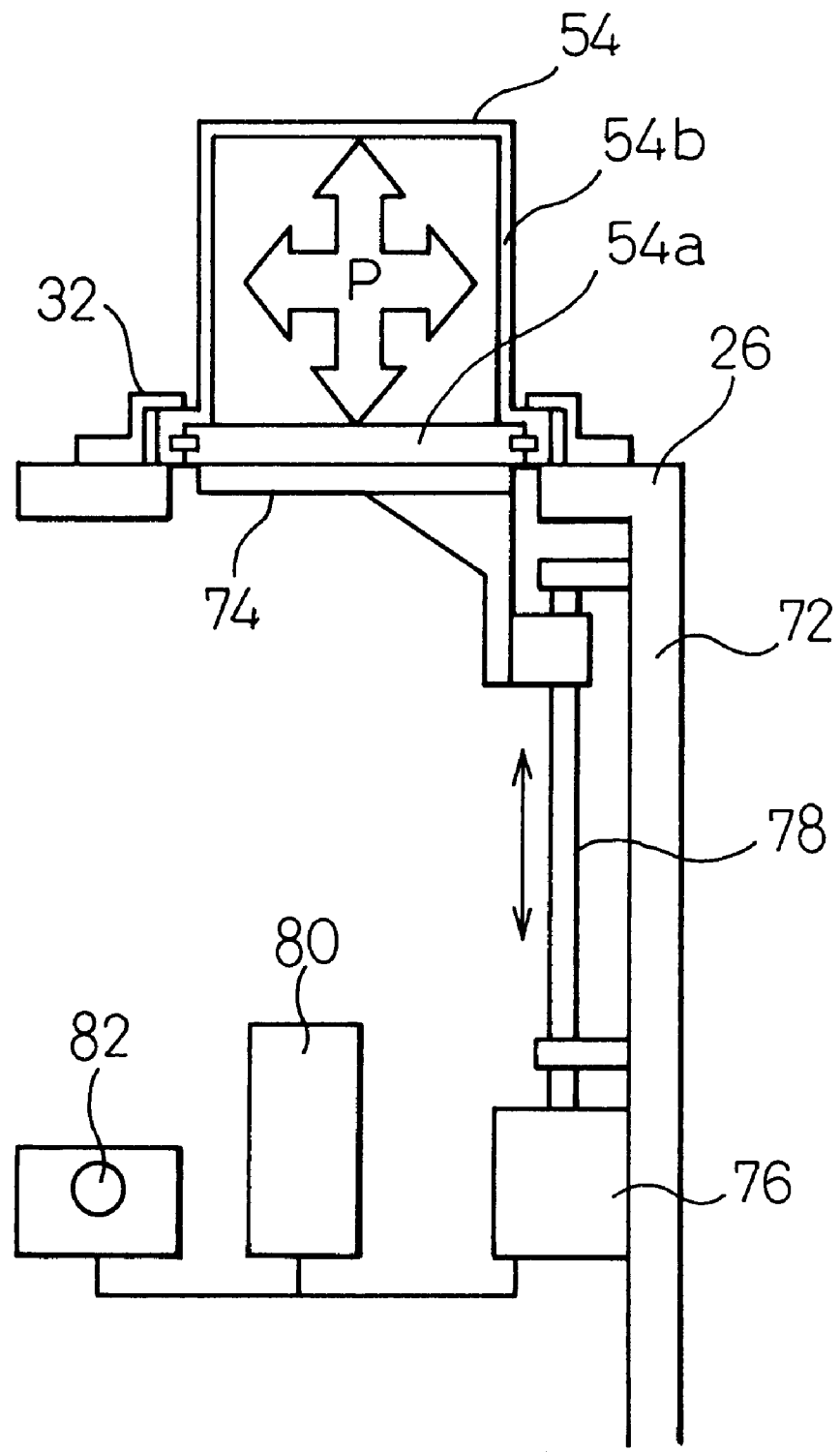
FIG. 16 is a view illustrating another embodiment of the method of inspecting the container according to the present invention.
Figure 17:
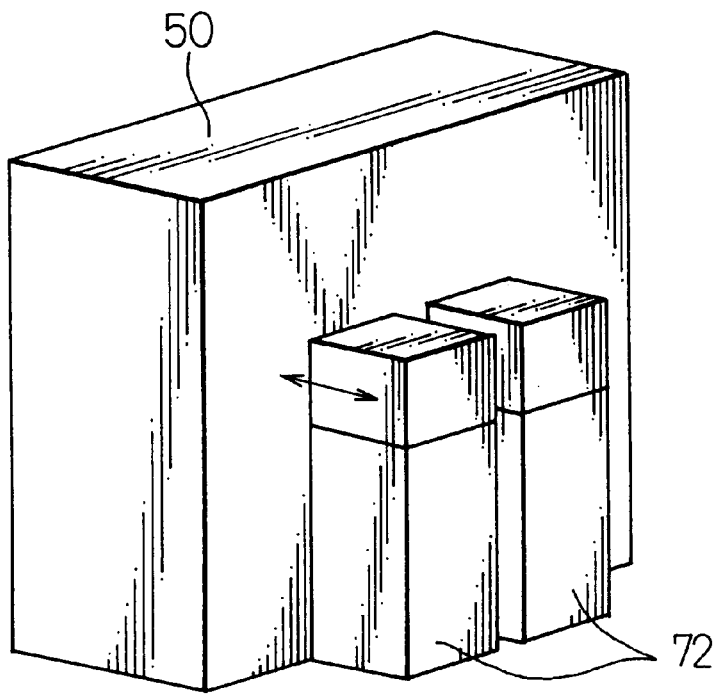
FIG. 17 is a view illustrating a treating apparatus and a loading device.

FIG. 16 is a view illustrating another embodiment of the method of inspecting the container according to the present invention. This embodiment uses a loading device 72 of the SMIF system. As shown in FIG. 17, the loading device 72 of the SMIF system is arranged in combination with the treating apparatus 50. The loading device 72 includes the support portion 26 for the container, and the support portion 26 includes a moving port plate 74.

The base portion 54a of the container 54 is placed on the port plate 74. When the locking mechanism 28 is unlocked, the base portion 54a is lowered together with the port plate 74 relative to the fixed cover 54b of the container 54. The cassette 52 of FIG. 7 is supported by the base portion 54a with the works 56 carried thereby, and is lowered together with the base portion 54*a*. The transfer arms corresponding to the transfer arms 36 of the foregoing embodiments are located at a position where the base portion 54*a* is lowered, and the cassette 52 carrying the works 56 is transferred into the treating apparatus 50.

The port plate 74 is moved by a motor 76 via a ball screw 78. A power source 80 and an ammeter 82 are connected to the motor 76. In this embodiment, the force Q applied to the cover portion 54*b* is detected by the ammeter 82 as a load current of the motor 76 that opens and closes the cover portion 54*b*. The constitution for opening the container 54, by lowering the base portion 54*a* of the container 54, may also be provided for the trolley 12 of the foregoing embodiments.

This embodiment makes it possible to carry out the step for inspecting the function of the locking device 28 and the step for transferring the works 56. The step for transferring the works 56 is to take out the works 56 together with the cassette 52 from the container 54 containing the works 56, and to transfer them to the treating apparatus 50. In this case, after the works 56 are taken out together with the cassette 52 from the container 54, the port plate 74 is raised together with the base portion 54*a*, and the above-mentioned inspection is conducted in a state in which the base portion 54*a* is hermetically sealed by the cover portion 54*b* by using the locking device 28.

Figure 18:
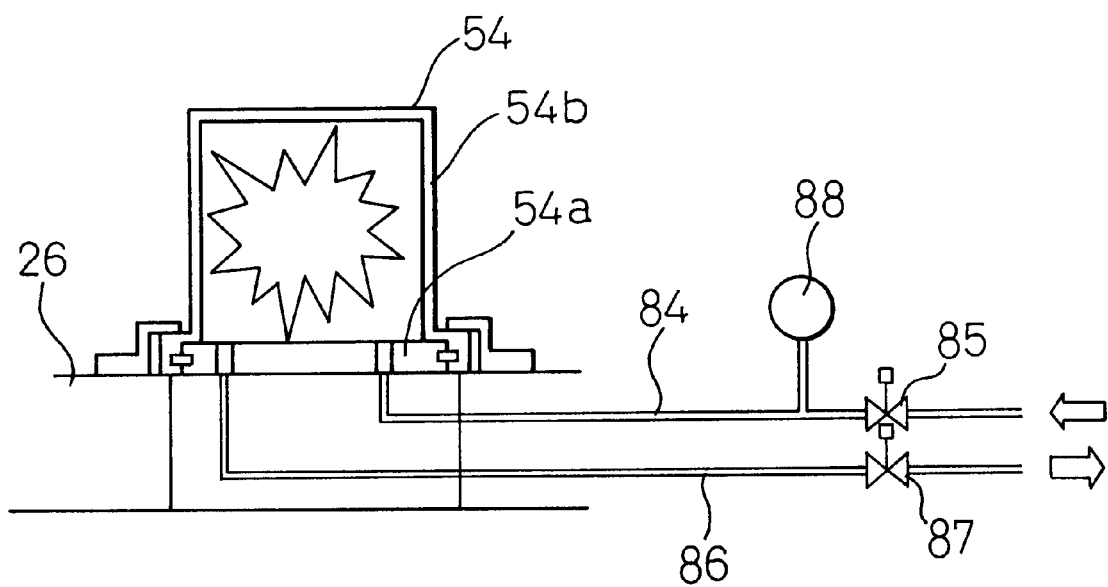
FIG. 18 is a view illustrating a further embodiment of the method of inspecting the container according to the present invention.

FIG. 18 is a view illustrating a further embodiment of the method of inspecting the container according to the present invention. In this embodiment, a gas introduction pipe 84 and a gas release pipe 86 are connected to the base portion 54*a* of the container 54. The gas introduction pipe 84 has a valve 85 and the gas release pipe 86 has a valve 87. A pressure gauge 88 is provided for the gas introduction pipe 84. According to this constitution, though not diagramed in FIG. 14, the pressurized gas such as nitrogen or CDA can be introduced into the container 54 through the gas introduction pipe 84, and the force Q applied to the cover portion 54*b* can be measured by a suitable means.

According to the embodiment of FIG. 18, further, the gas is introduced through the gas introduction pipe 84 in a state where the container 54 is hermetically sealed, the gas is then evacuated through the gas release pipe 86, the gas is again introduced into the container 54, the gas is then released, and this cycle is repeated several times to recover the cleanliness of the container. In the container 54, therefore, the gas violently moves to remove particles adhered to the inside of the container 54. This eliminates labor for disassembling and washing the container 54.

The force Q applied to the cover portion 54*b* can be detected by any means in addition to detecting it as a load current of the motor 76.

Figure 19:
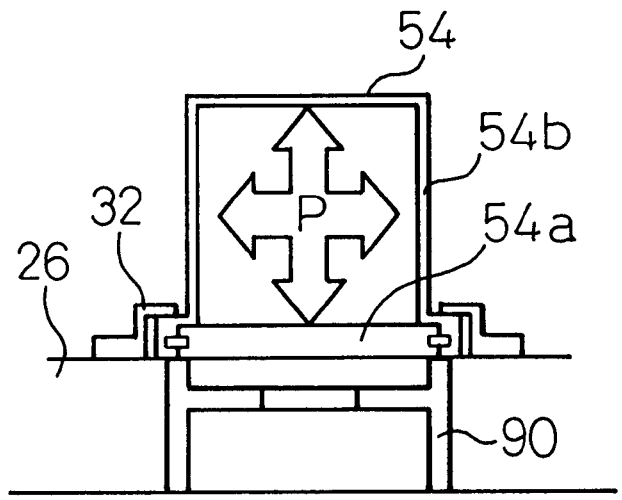
FIG. 19 is a view illustrating a still further embodiment of the method of inspecting the container according to the present invention.

FIG. 19 illustrates an example in which the force Q applied to the cover portion 54*b* is measured by a spring balance 90.

Figure 20:
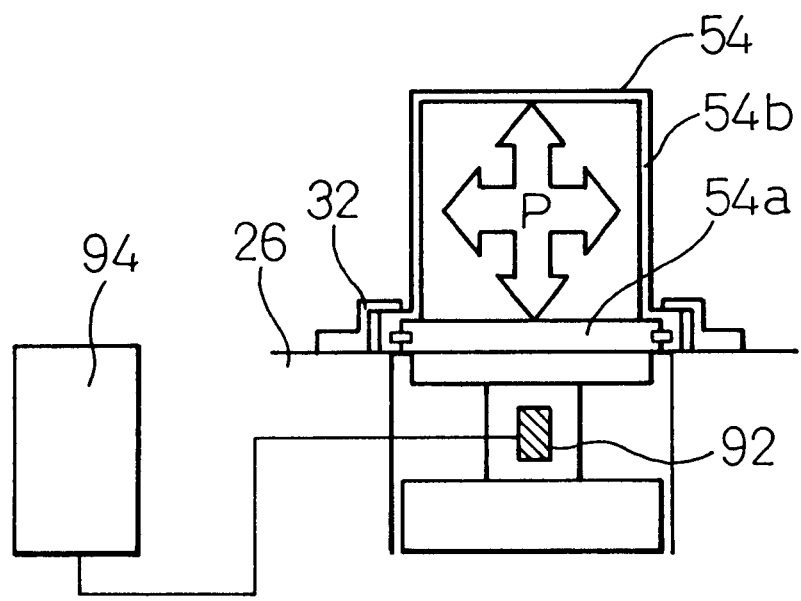
FIG. 20 is a view illustrating a yet further embodiment of the method of inspecting the container according to the present invention.

FIG. 20 illustrates an example in which the force Q applied to the cover portion 54*b* is measured by a distortion gauge 92. A dynamic distortion gauge 94 is connected to the distortion gauge 92.

According to the present invention as described above, there is provided a work conveying and transferring apparatus which can convey the works in a clean condition and transfer the works into the treating apparatus in the clean condition. According to the present invention, further, the container for containing the works is easily inspected, and the container can be used as long as the function of the container can be guaranteed. Further, the works are treated, the container is inspected and the recovery processing is executed by the same loading device.

Figure 22:
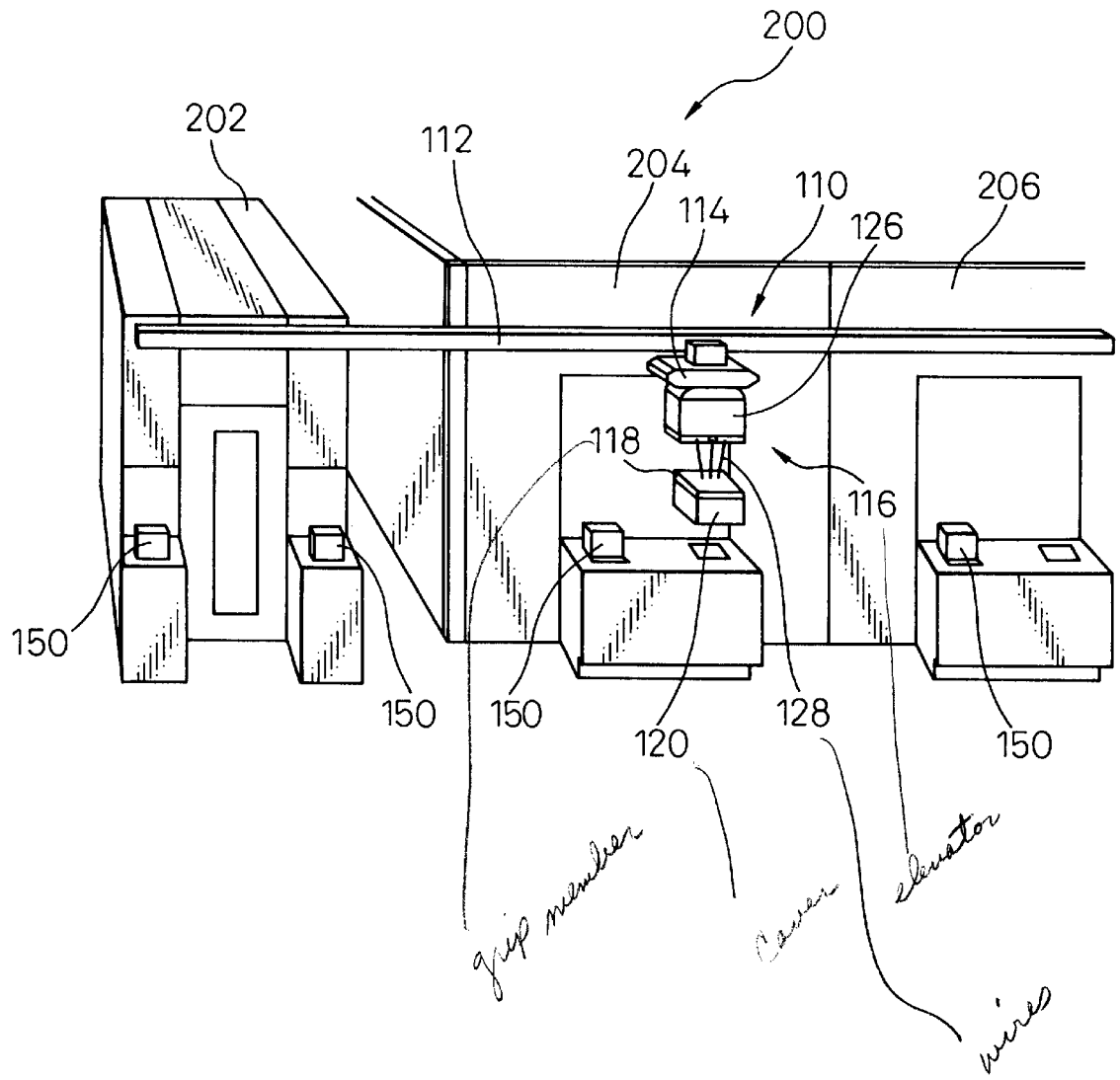
FIG. 22 is a view illustrating a semiconductor manufacturing apparatus according to the embodiment of the present invention.
Figure 23:
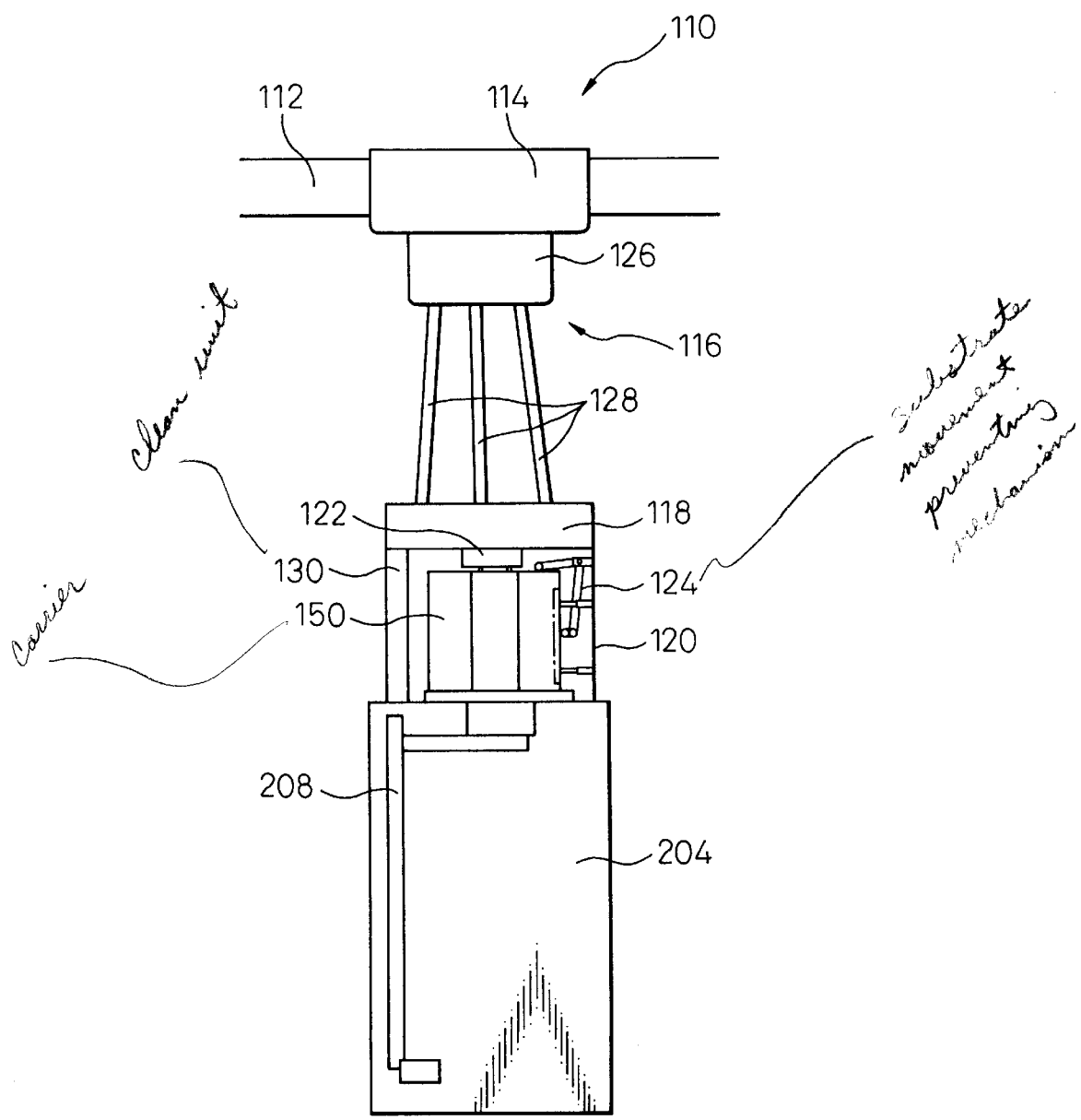
FIG. 23 is a view illustrating the conveying apparatus of FIG. 22.

FIG. 22 is a view illustrating a semiconductor manufacturing apparatus 200 according to the further embodiment of the present invention, and FIG. 23 is a view illustrating a conveying apparatus 110 in FIG. 22.

The semiconductor manufacturing apparatus 200 includes a stocker 202, a plurality of semiconductor treating apparatuses 204 and 206, and a conveying apparatus 110. The stocker 202 holds substrates such as semiconductor wafers, and the semiconductor treating apparatuses 204 and 206 execute processings for the substrates as are known in the manufacture of the semiconductor devices. The semiconductor treating apparatuses 204 and 206 have an elevator device 208 for inserting and taking out the substrates. The conveying apparatus 110 conveys the substrates between the stocker 202 and the semiconductor treating apparatus 204 or 206 or between the semiconductor treating apparatus 204 and the semiconductor treating apparatus 206.

Figure 28:
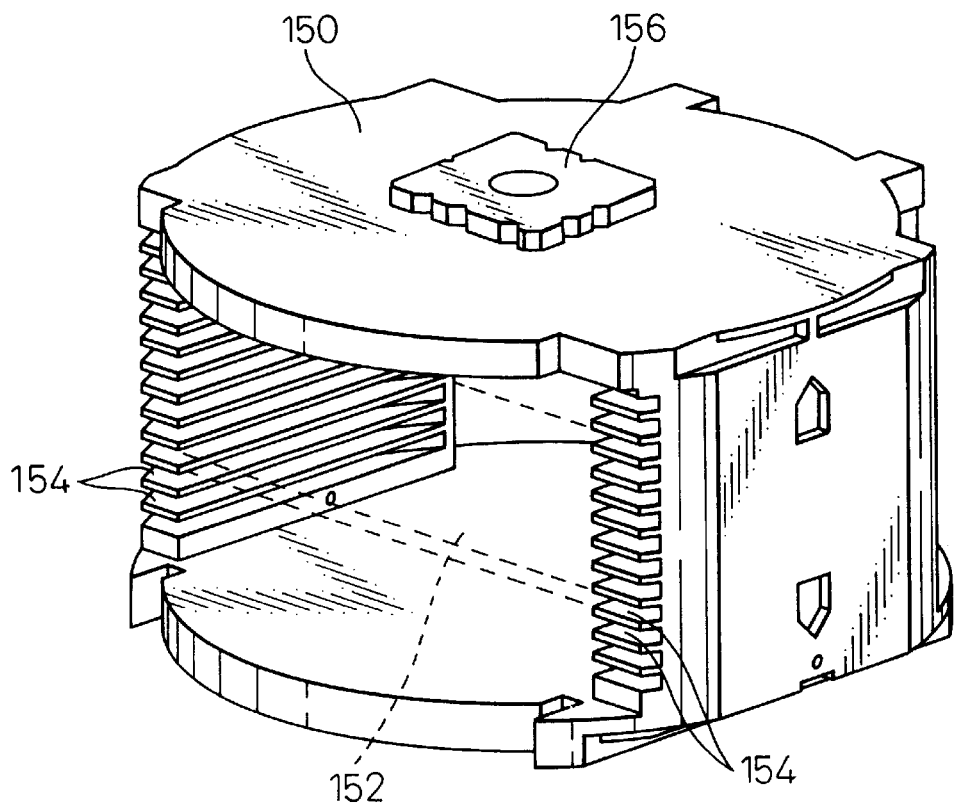
FIG. 28 is a view illustrating the carrier for containing the substrates.

FIG. 28 is a view illustrating a carrier 150 for containing the substrates 152 such as semiconductor wafers. The carrier 150 is a container with its front portion opened, and has a plurality of substrate accommodating grooves 154 formed in both side portions thereof. The substrates 152 are inserted in the substrate accommodating grooves 154 and are held in the carrier 150 maintaining a horizontal attitude.

Figure 31:
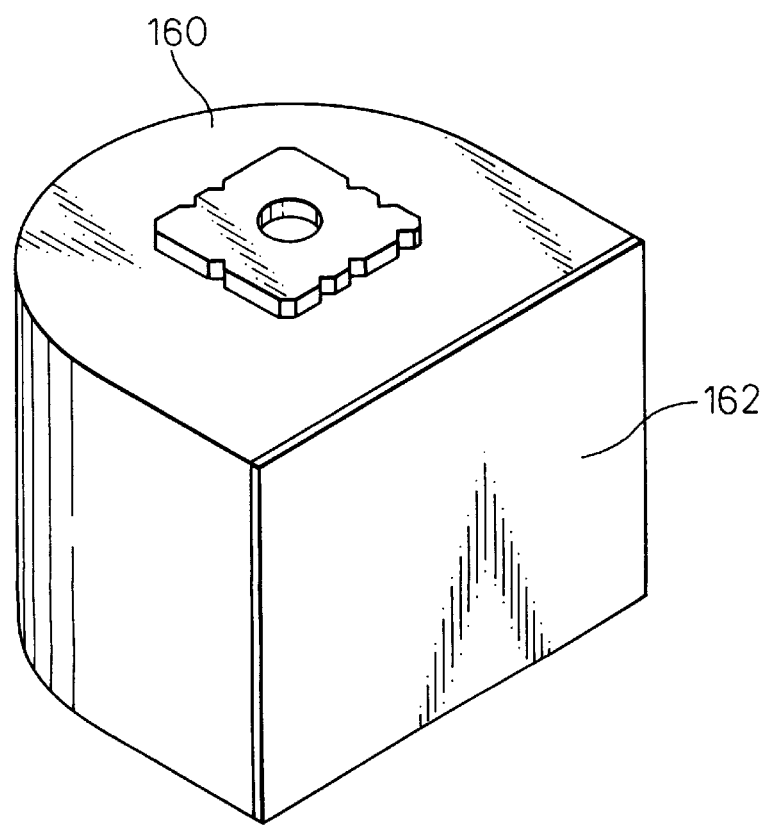
FIG. 31 is a view illustrating a closed box for accommodating the carrier.

FIG. 31 shows a hermetically sealed box 160. The sealed box 160 is capable of accommodating the carrier 150 (FIG. 28) that contains the substrates 152, and has a closure 162 for closing the front opening portion after the carrier 150 is contained therein. The sealed box 160 has an air tight structure and is adapted to conveying the substrates 152 maintaining a clean environment. Use of the sealed box 160, however, requires an additional cost for the carrier 150. The conveying apparatus 110 of the present invention is so constituted that the carrier 150 containing the substrates 152 can be conveyed in a state of a clean environment without using the sealed box 160.

The conveying apparatus 110 conveys the carrier 150 containing the substrates 152. The elevator device 208 is used for transferring the carrier 150 into the semiconductor treating apparatus 204 or 206, or for transferring the carrier 150 to the outer side of the semiconductor treating apparatus 204 or 206. The substrates 152 are transferred into the semiconductor treating apparatus 204 or 206 and are taken out from the carrier 150, and are treated. The substrates 152, after being treated, are contained again in the carrier 150 which is then transferred to the outer side of the semiconductor treating apparatus 204 or 206 and is conveyed by the conveying apparatus 110.

In FIGS. 22 and 23, the conveying apparatus 110 includes a rail 112 extending along a ceiling, and a conveyer trolley 114 hanging from the rail 112 and traveling along the rail 112. The conveyer trolley 114 includes an elevator 116, a grip member 118 supported by the elevator 116 so as to be raised and lowered relative to the conveyer trolley 114, a cover 120 provided for the grip member 118 and having an open lower end, a carrier mounting device 122, and a substrate movement preventing mechanism 124.

The elevator 116 is a hoist and is constituted by a wire drive mechanism 126 inclusive of a motor, and a plurality of elevating wires 128 driven by the wire drive mechanism 126. The wire drive mechanism 126 includes a motor and a gear mechanism (not shown), one end of each of the elevator wires 128 is operably coupled to a suitable gear, and the other end of each of the elevator wires 128 are fastened to the grip member 118. When the motor is actuated, therefore, the elevator wires 128 are raised or lowered while maintaining the grip member 118 in a horizontal attitude. Here, the word "wires 128" includes belts, straps, ropes and cords.

The grip member 118 has a rectangular box-like structure of a small height, and the cover 120 hangs down from the rectangular peripheral portion of the grip member 118 and forms, together with the grip member 118, a box-like space with its lower portion opened. The carrier mounting device 122 is disposed on the lower side of the grip member 118 and grips the carrier 150 containing the substrates 152 in a hanging manner. Being gripped by the carrier mounting device 122, the carrier 150 containing the substrates 152 is covered over its upper portion and periphery with the grip member 118 and the cover 120. Therefore, the carrier 150 containing the substrates 152 is protected against foreign matter falling from the upper side and foreign matter suspended in the air. In the conveying device 110 that travels along the ceiling, less foreign matter whirls up from the lower side, and the carrier 150 containing the substrates 152 is substantially completely protected from the external environment.

A cleaning unit 130 is incorporated in one side of the cover 120 to blow out the clean air. The cleaning unit 130 includes a fan driven by a motor and a filter, and blows out clean air to the rear portion of the carrier 150 that contains the substrates 152. Therefore, a cleaner environment is maintained inside the cover 120.

Figure 24:
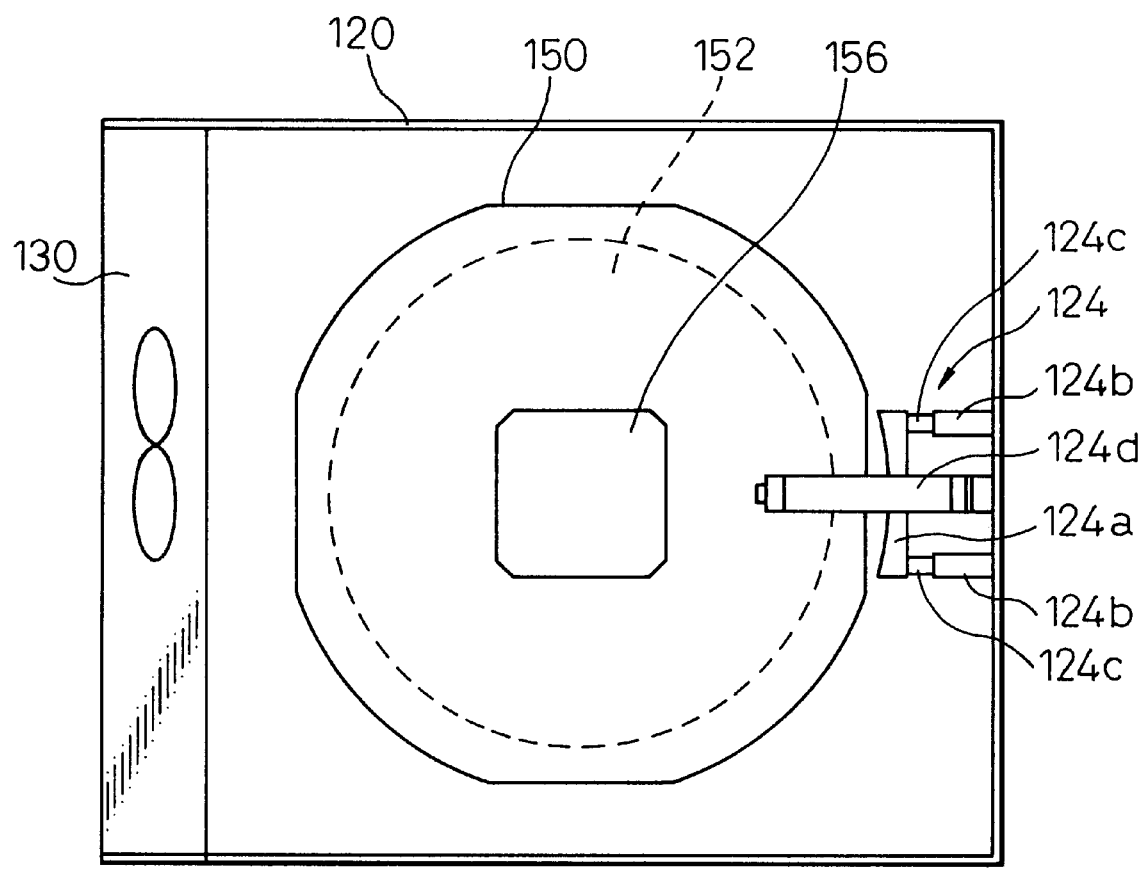
FIG. 24 is a plan view illustrating the cover of the conveyer trolley and the carrier shown in FIGS. 22 and 23, with grip member removed.

FIG. 24 is a plan view illustrating the cover 120 and the carrier 150 with the grip member 118 removed. In FIGS. 24 and 28, the carrier 150 has, at the upper surface thereof, an engaging member 156 called a mushroom. An engaging gap is formed between the upper surface of the carrier 150 and the lower surface of the engaging member 156.

Figure 29:
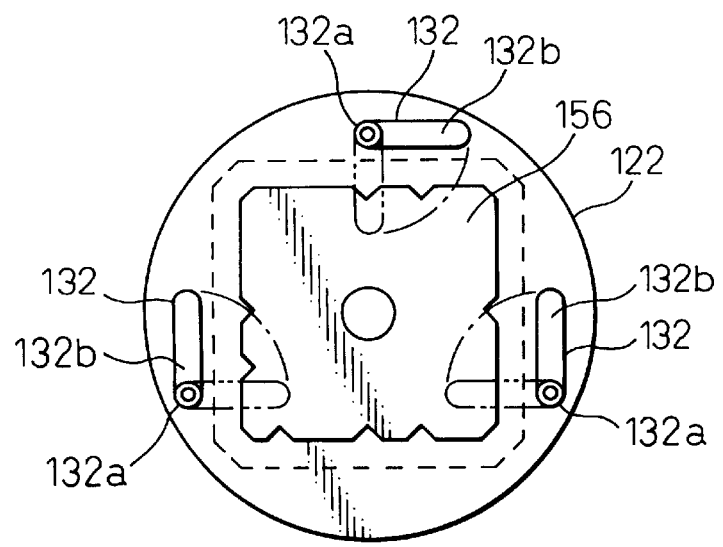
FIG. 29 is a plan view illustrating a carrier mounting device with the grip member removed.
Figure 30:
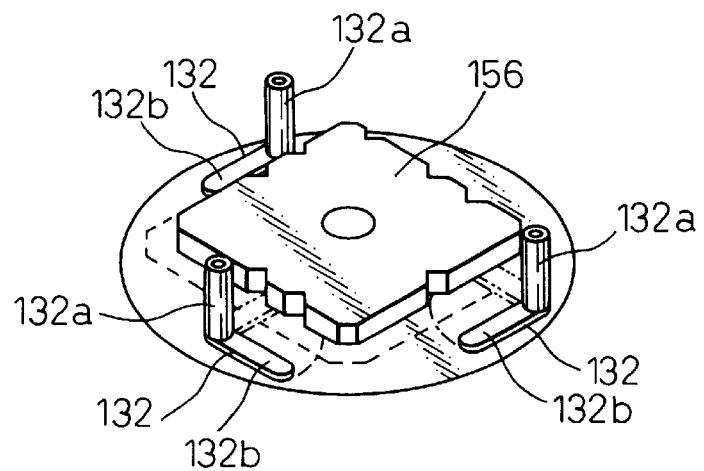
FIG. 30 is a perspective view of the carrier mounting device.

FIG. 29 is a plan view illustrating the carrier mounting device 122 from which the grip member 118 is removed, and FIG. 30 is a perspective view of the carrier mounting device 122 shown in FIG. 21. The carrier mounting device 122 of this embodiment has three chuck devices 132 at positions on the outer side of the outer periphery of the engaging member 156 of the carrier 150. Each chuck device 132 has a shaft 132a that extends vertically and a horizontal engaging piece 132b attached to the shaft 132a. The shaft 132a extends upward to enter into the grip member 118 and is operably coupled to a drive means (not shown) provided in the grip member 118. The drive means includes a motor or an electromagnetic actuator.

Being actuated by the drive means, the chuck device 132 moves between a first position at which the horizontal engaging piece 132b becomes in parallel with the outer periphery of the engaging member 156 of the carrier 150 and a second position at which the horizontal engaging piece 132b becomes perpendicular to the outer periphery of the engaging member 156 of the carrier 150 and enters into the engaging gap between the upper surface of the carrier 150 and the lower surface of the engaging member 156. The chuck device 132 does not come into engagement with the carrier 150 at the first position of the horizontal engaging piece 132b but comes into engagement with the carrier 150 at the second position of the horizontal engaging piece 132b.

Figure 25:
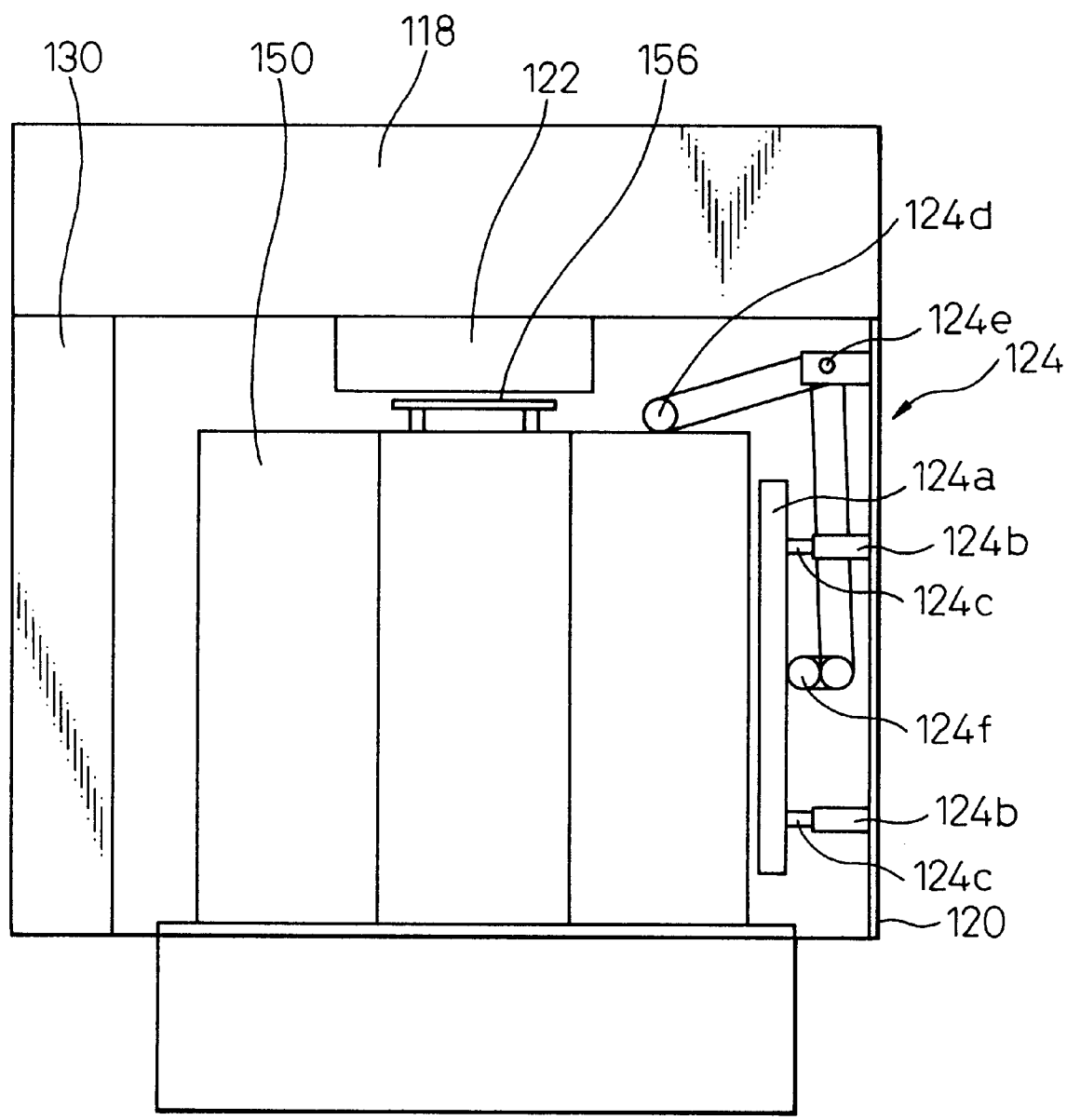
FIG. 25 is a schematic vertical sectional view illustrating the grip member and the cover including the substrate movement preventing mechanism, of FIG. 24.
Figure 26:
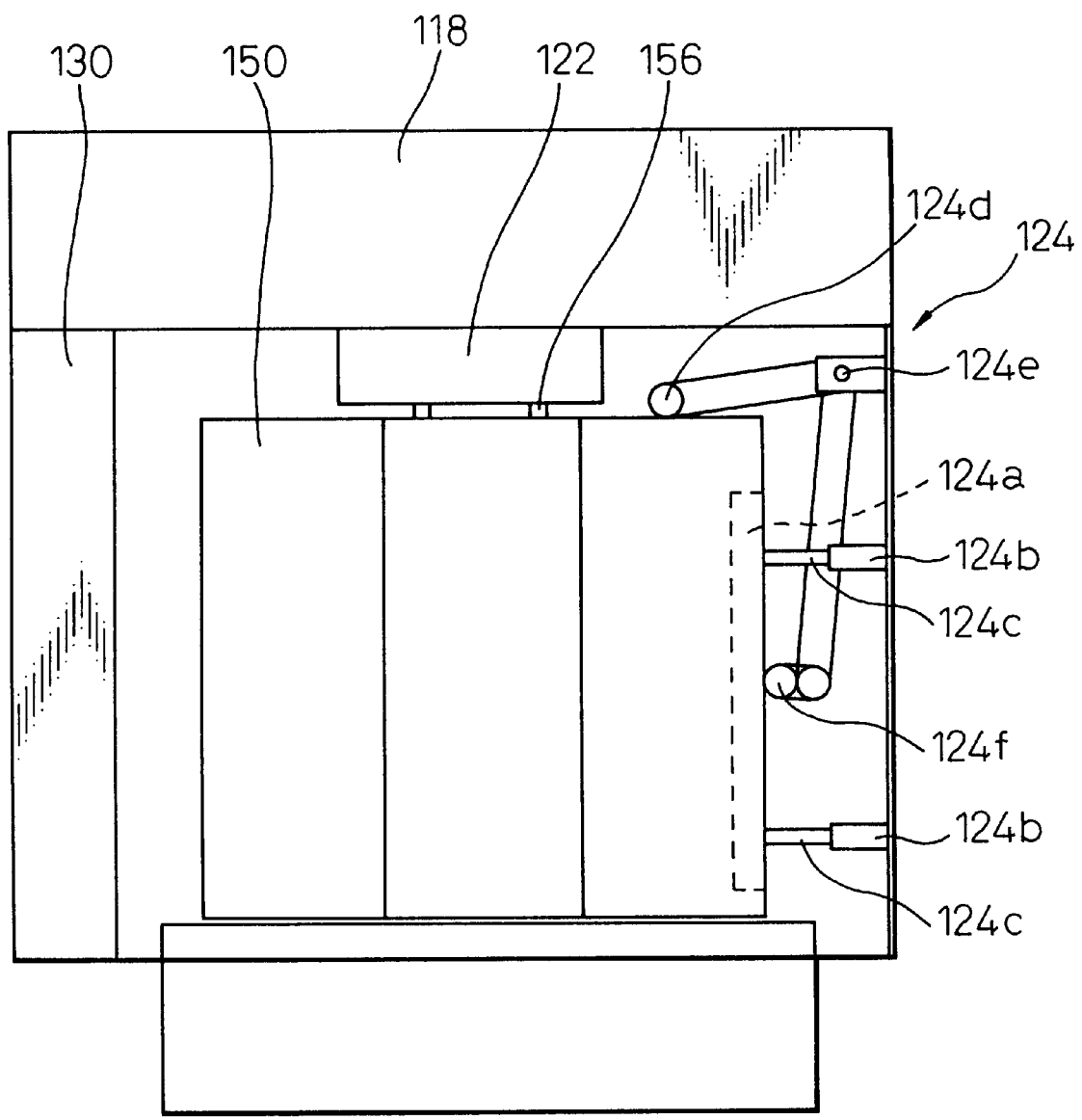
FIG. 26 is a schematic vertical sectional view illustrating the grip member and the cover with the substrate movement preventing mechanism in the operated state.

FIG. 24 illustrates the substrate movement preventing mechanism 124. FIG. 25 is a schematic vertical sectional view illustrating the grip member 118 that includes the substrate movement preventing mechanism 124 of FIG. 24 and the cover 120. FIG. 26 is a schematic vertical sectional view illustrating the grip member 118 and the cover 120 in a state where the substrate movement preventing mechanism 124 is in operation. The substrate movement preventing mechanism 124 has a substrate closing plate 124 a which is so arranged as to be opposed to the front opening portion (FIG. 28) of the carrier 150. The substrate closing plate 124a is attached to the cover 120 by posts 124b and springs 124c. The springs 124c are so disposed as to pull the substrate closing plate 124a toward the posts 124b.

An upper lever arm 124d is disposed to come into contact with the upper surface of the carrier 150, and is attached to the cover 120 so as to turn about a fulcrum 124e. A side lever arm 124f is disposed to come into contact with the substrate closing plate 124a, and is allowed to turn about the fulcrum 124e together with the upper lever arm 124d.

FIG. 25 is a view illustrating a state before the carrier mounting device 122 comes into engagement with the engaging member 156 of the carrier 150. As the grip member 118 is lowered, the upper lever arm 124d comes in contact with the upper surface of the carrier 150 and turns about the fulcrum 124e being pushed up by the upper surface of the carrier 150. Therefore, the side lever arm 124f also turns about the fulcrum 124e to push the substrate closing plate 12a. As shown in FIG. 26, therefore, the substrate closing plate 124a advances toward the carrier 150 against the springs 124c and is positioned at the front edge of the front opening portion of the carrier 150. The substrate closing plate 124a is positioned quite near the substrates 152 contained in the carrier 150. Accordingly, even when the conveyer trolley 114 is moved, the substrates 152 are prevented from moving out of the front opening portion of the carrier 150.

When the grip member 118 is elevated, the upper lever arm 124d and the side lever arm 124f turn in the directions opposite to those described above, and the substrate closing plate 24a moves away from the carrier 150 being pulled by the springs 124c. Then, the carrier mounting device 122 disengages from the engaging member 156 of the carrier 150 permitting the grip member 118 to be elevated.

Therefore, the conveying apparatus of the present invention is capable of conveying the carrier 150, even if it has the front opening portion, while maintaining the substrates in a clean environment without permitting the substrates to jump over through the front opening portion of the carrier 150. In particular, there is no need to use a special sealed box 160 shown in FIG. 31, contributing to decreasing the cost.

Figure 27C:
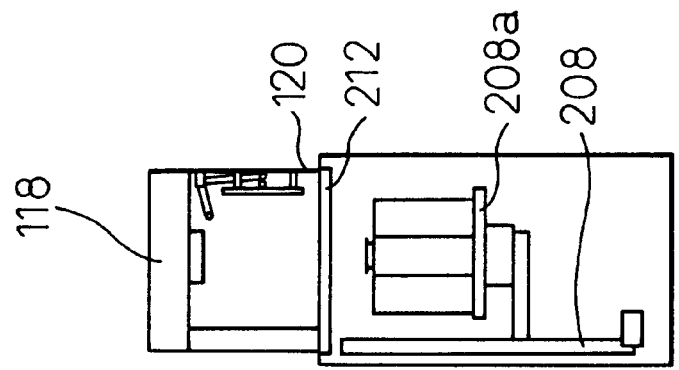
FIGS. 27A to 27C are views illustrating an example of transferring the carrier into the semiconductor treating apparatus when the conveying trolley arrives at the semiconductor treating apparatus.
Figure 27B:
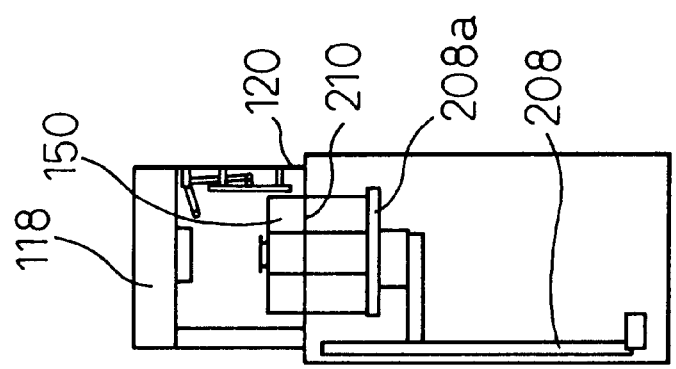
Figure 27A:
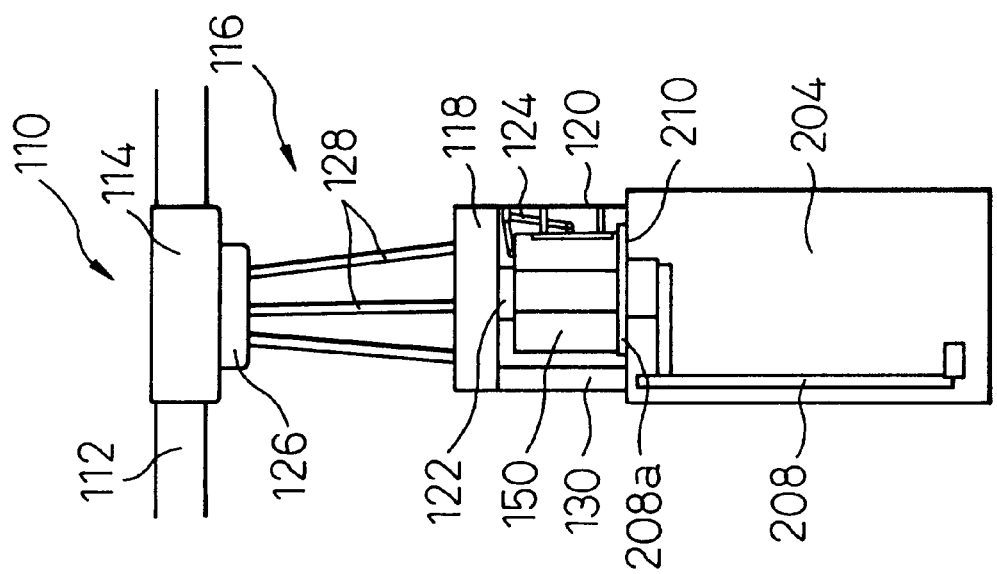

FIGS. 27A to 27C are views illustrating an example of transferring the carrier 150 into the semiconductor treating apparatus 204 when the conveyer trolley 114 has reached the semiconductor treating apparatus 204. The semiconductor treating apparatus 204 has a carrier port 210 which is normally closed by a top plate 208a of the elevator device 208. The top plate 208a of the elevator device 208 is so arranged as to receive the carrier 150 when the conveyer trolley 114 has arrived at the semiconductor treating apparatus 204. Therefore, after the conveyer trolley 114 has arrived at the semiconductor treating apparatus 204, the carrier mounting device 122 disengages from the engaging member 156 of the carrier 150, and the elevator device 208 is operated in a state in which the grip member 118 is maintained at that position (FIG. 27A). Therefore, the top plate 208a descends, and the carrier 150 descends in a state of being placed on the top plate 208a (FIG. 27B). As the top plate 208a and the carrier 150 further descends (27C), the operation device that is not shown takes out the substrates 152 from the carrier 150. A partitioning plate 212 closes the carrier port 210.

Figure 32:
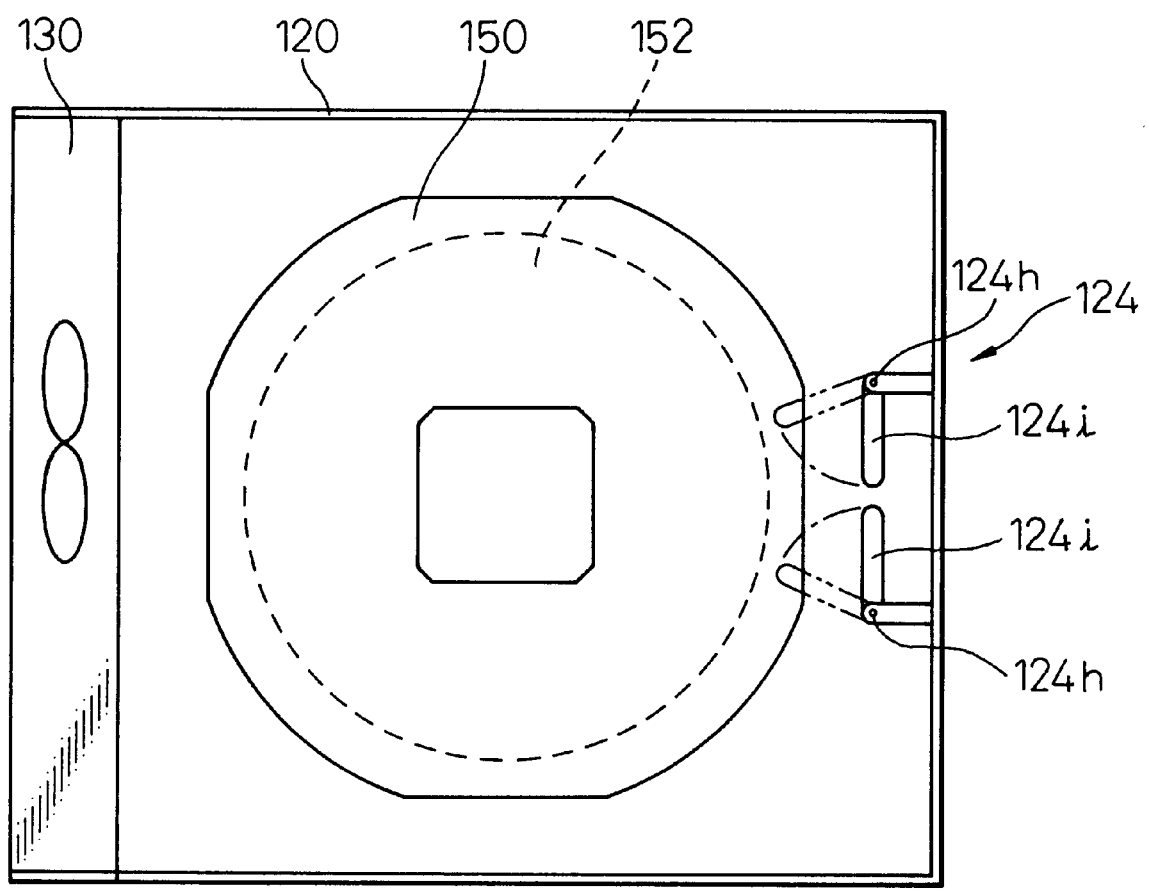
FIG. 32 is a plan view illustrating the cover including the substrate movement preventing mechanism of a modified example.

FIG. 32 is a plan view similar to FIG. 24 and illustrates the cover 120 including a modified embodiment of the substrate movement preventing mechanism 124. The substrate movement preventing mechanism 124 has two vertically extending shafts 124*h* and two horizontal engaging pieces 124*i* attached to the shafts 124*h*. The horizontal engaging pieces 124*i* are arranged at positions slightly on the outer side of the front opening portion of the carrier 150 to substitute for the substrate closing plate 24*a* of FIG. 24. Upon turning the shafts 124*h*, the horizontal engaging pieces 124*i* are caused to move between a first position at which they become into parallel with the outer periphery of the carrier 150 and a second position at which they enter the front opening portion of the carrier 150 to prevent the substrates 152 from sliding down.

Figure 33:
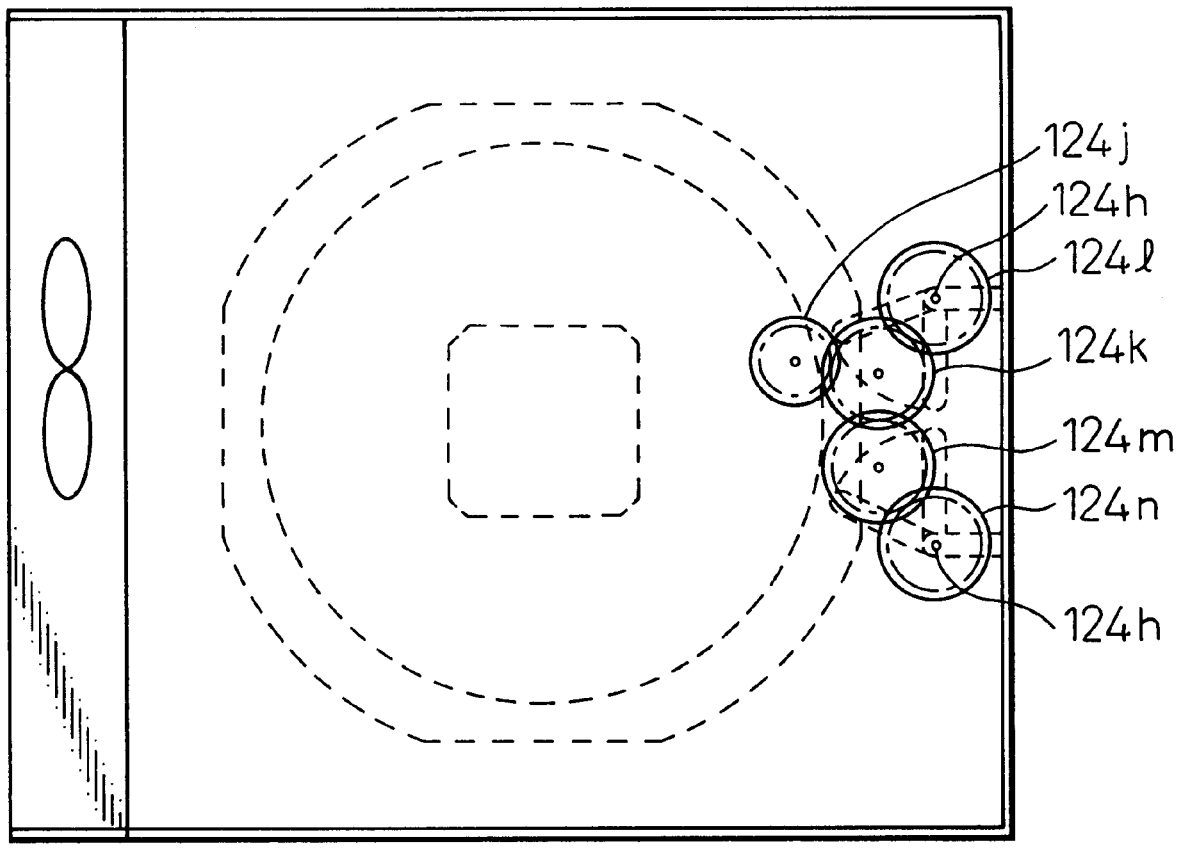
FIG. 33 is a view illustrating the drive mechanism for the substrate movement preventing mechanism.
Figure 34:
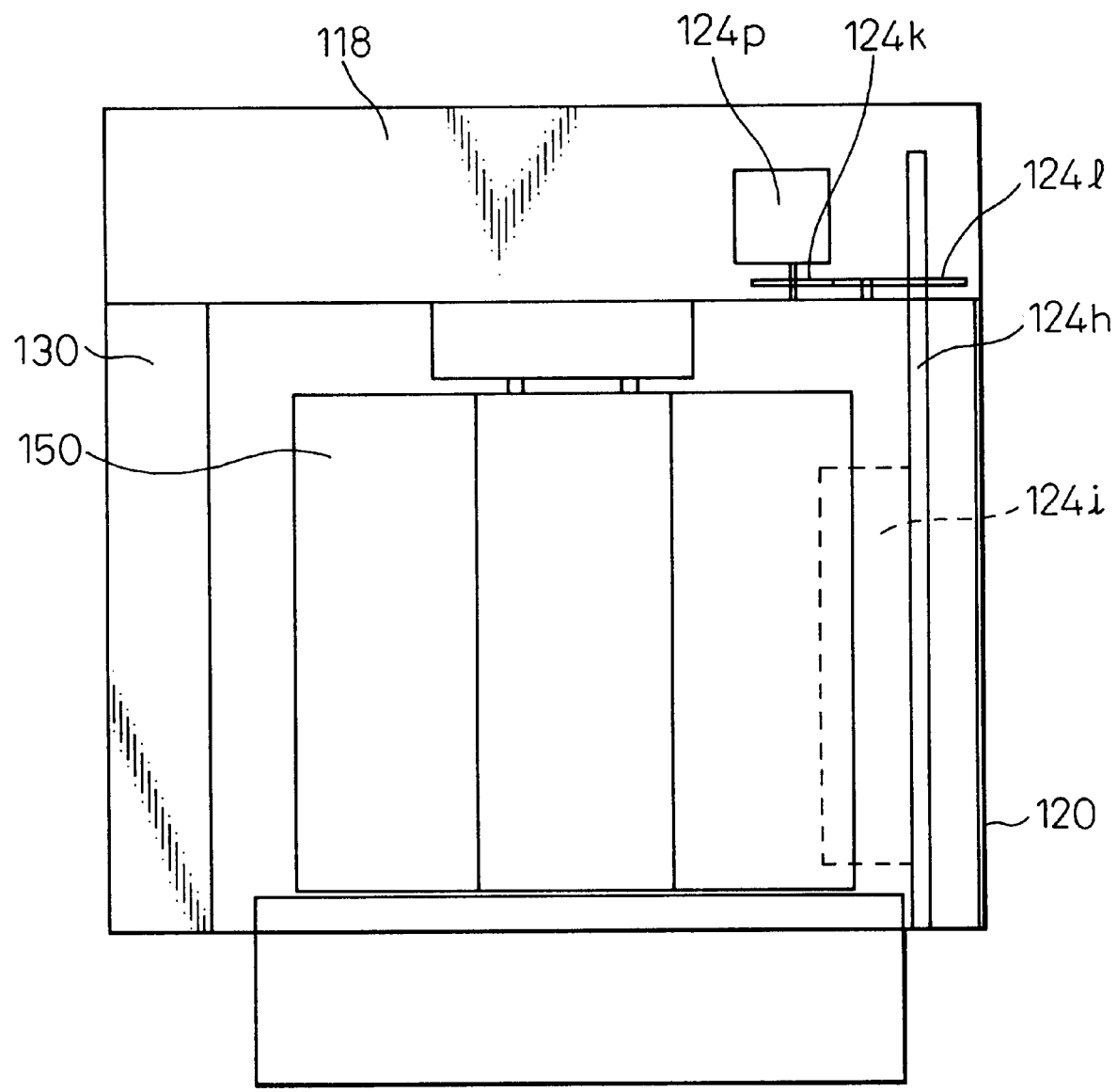
FIG. 34 is a schematic vertical sectional view of the grip member including the drive mechanism for the substrate movement preventing mechanism of FIG. 32 and the cover.

FIG. 33 is a view illustrating a drive mechanism in the substrate movement preventing mechanism 124 of FIG. 32. FIG. 34 is a schematic vertical sectional view illustrating the grip member 118 including the drive mechanism of the substrate movement preventing mechanism 124 of FIG. 32 and the cover 120. The drive mechanism of the substrate movement preventing mechanism 124 can be provided, for example, in the grip device 118. The drive mechanism includes a motor gear 124*j* connected to a motor 124*p*, and gears 124*k*, 124*l*, 124*m* and 124*n*. One shaft 124*h* is driven by the gear 124*l* and another shaft 124*h* is driven by the gear 124*n*.

Figure 35:
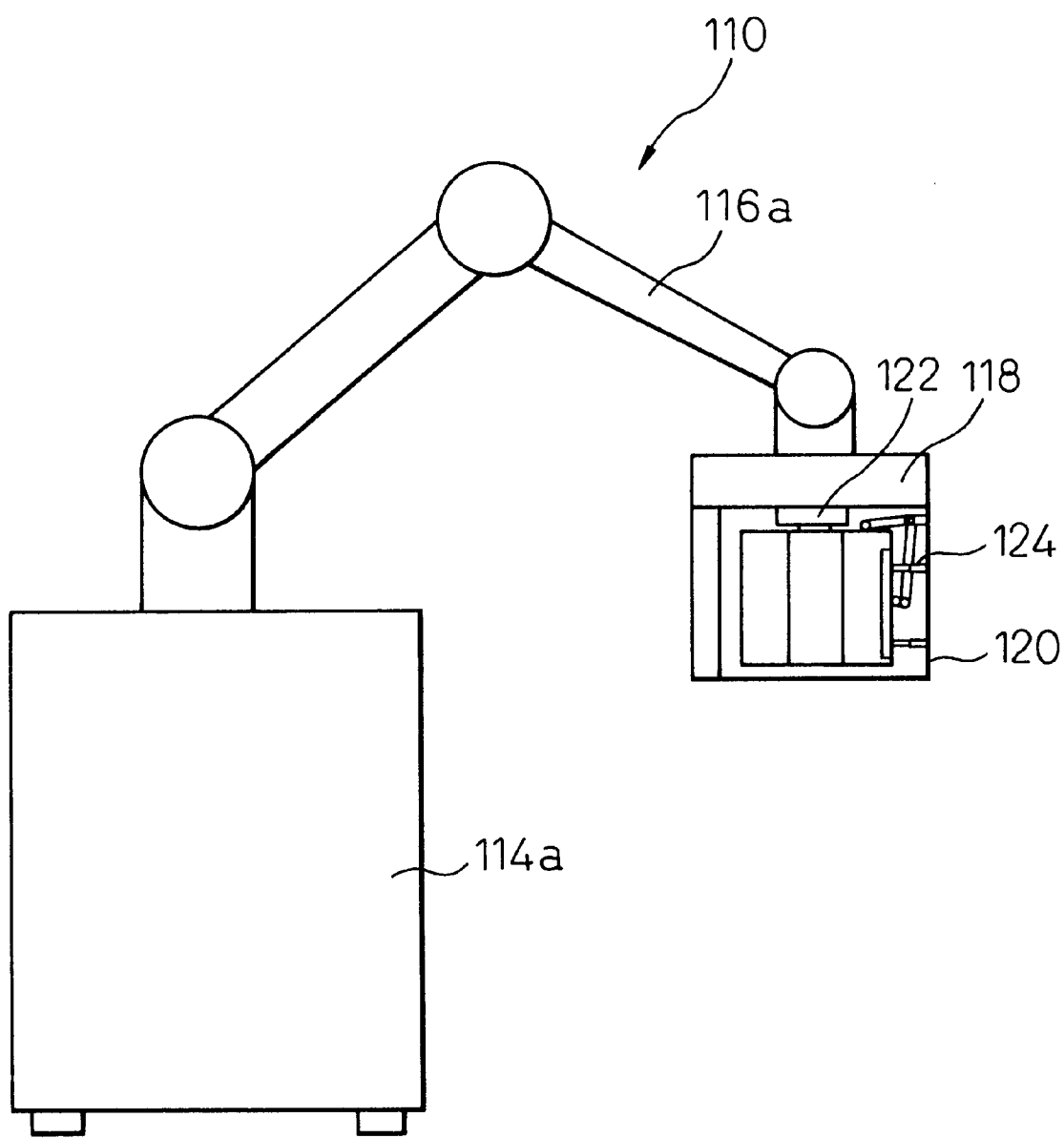
FIG. 35 is a view illustrating another example of the conveying apparatus.

FIG. 35 is a view illustrating another embodiment of the conveying apparatus 110. The conveying apparatus 110 includes the conveyer trolley 114*a* that travels on a floor, a robot arm 116*a* provided on the conveyer trolley 114*a* to ascend and descend, a grip member 118 provided in the robot arm 116*a*, a cover 120 having its lower portion opened and provided on the grip member 118, a carrier mounting device 122 and a substrate movement preventing mechanism 124. The grip member 18, the cover 120, the carrier mounting device 122 and the substrate movement preventing mechanism 124 are identical to those of the embodiments described with reference to FIGS. 22 to 34. In this constitution, too, the carrier 150 having the front opening portion can be conveyed maintaining the substrates in a clean environment without permitting them to move beyond the front opening portion of the carrier 150. In particular, there is no need to use the particular sealed box 60 shown in FIG. 31, contributing to decreasing the cost.

Figure 36:
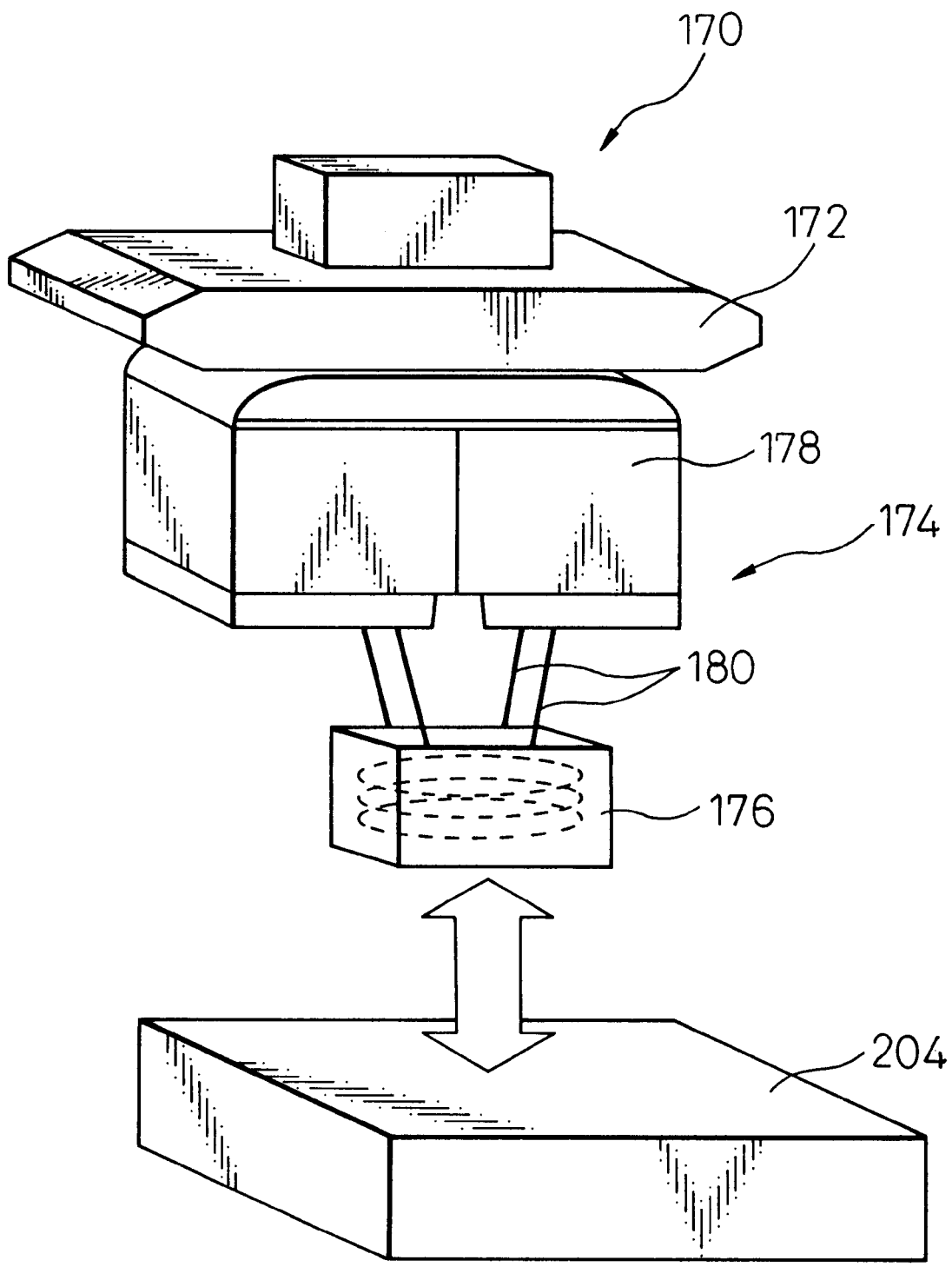
FIG. 36 is a view illustrating the conveying apparatus according to a further embodiment of the present invention.
Figure 37:
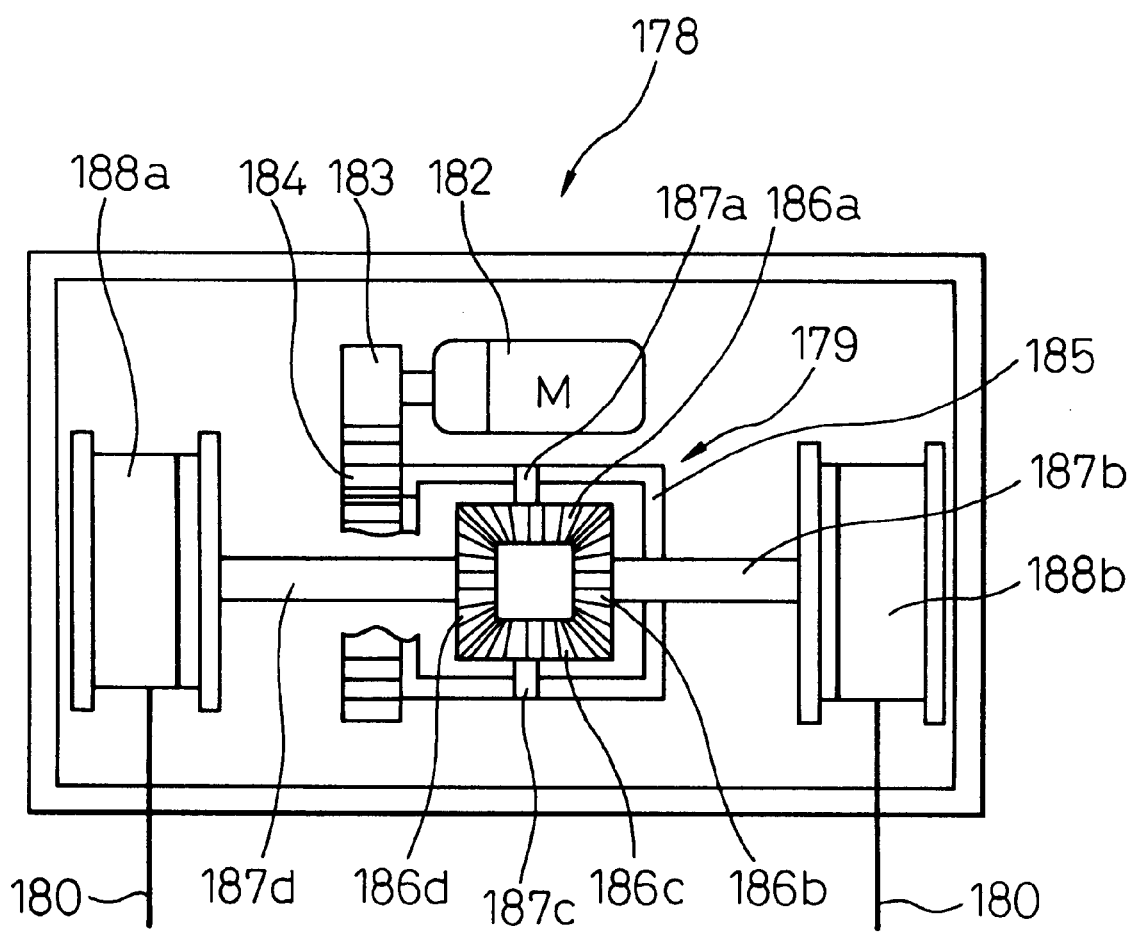
FIG. 37 is a view illustrating in detail a wire drive mechanism for the elevator shown in FIG. 36.

FIGS. 36 and 37 are views illustrating a conveying apparatus 170 according to a still further embodiment of the present invention. The conveying apparatus 170 has a conveyer trolley 172. The conveyer trolley 172 is hung from a rail extending along the ceiling and runs along the rail like the conveyer trolley 114 of the conveying apparatus 210 of the semiconductor manufacturing apparatus shown in FIGS. 22 to 34. Here, however, the conveyer trolley 172 is not limited to the above mentioned trolley only.

The conveyer trolley 172 includes an elevator 174 and a member 176 supported by the conveyer trolley 172 so as to be raised and lowered by the elevator 174. When the conveying apparatus 170 is used in the same way as the conveying apparatus 110 in the semiconductor manufacturing apparatus 200 of the above-mentioned embodiment, the member 176 corresponds to the grip member 118 that grips the carrier 150 containing the substrates 152 therein. Or, the member 176 may grip the sealed container 160.

The elevator 174 is a hoist which comprises a wire drive mechanism 178 inclusive of a motor, and a plurality of elevator wires 180 driven by the wire drive mechanism 178. In FIG. 36, four wires 180 are shown. FIG. 37 illustrates the wire drive mechanism 178. The elevator wires 180 so act as to raise or lower the member 176 maintaining its horizontal attitude.

FIG. 37 is a view illustrating in detail the wire drive mechanism 178 of the elevator 174 shown in FIG. 36. The wire drive mechanism 178 includes a differential gear mechanism 179. That is, the wire drive mechanism 178 comprises a motor 182, a motor gear 183, a gear 184 that engages with the motor gear 183, and a differential case 185 that is secured to the gear 184 and rotates together with the gear 184. Four bevel gears 186*a*, 186*b*, 186*c* and 186*d* arranged in two pairs with two gears in the opposed relationship to each other along two axes intersecting at right angles, are arranged in the differential case 185, and shafts 187*a*, 187*b*, 187*c* and 187*d* are secured to these bevel gears. The shafts 187 and 187*c* are supported by the differential case 185 so as to rotate. The shafts 187*b* and 187*d* are supported by the differential case 185 and extend through the differential case 85. A drum 188*a* is attached to an end of the shaft 187*b*, and a drum 188*b* is attached to an end of the shaft 187*d*.

Four wires 80 (FIG. 36) constitute two pairs. The ends of one pair of wires 180 are fastened to one drum 188*a*, and the ends of another pair of wires 180 are fastened to another drum 188*b*. The other ends of these wires 180 are fastened to the member 176 to be supported.

When the motor 182 is turned in one direction, the rotation of the motor 182 is transmitted to the differential case 185 through the gear 184, and the rotation of the differential case 185 is transmitted to the drums 188*a* and 188*b* through the shafts 187*b* and 187*d*. Therefore, when the motor 182 is rotated in one direction, the drums 188*a* and 188*b* rotate, whereby the wires 180 are wound to raise the member 176. When the motor 182 is rotated in the reverse direction, the drums 188*a* and 188*b* rotate in the reverse direction, whereby the wires 180 are delivered to lower the member 176.

When a torque exerted on one drum 188*a* is equal to the torque exerted on the other drum 188*b* while the motor 182 is rotating, the two drums 188*a* and 188*b* rotate at the same rotational speed. However, when some wires 180 are elongated, the torque exerted on one drum 188*a* does not become equal to the torque exerted on the other drum 188*b*. In this case, the two bevel gears 186*b* and 186*d* rotate in the opposite directions relative to each other, and a difference occurs in the rotational speed between the two drums 188*a* and 188*b*. Accordingly, the rotational speed of the drum to which the elongated wires 180 are fastened becomes faster than the rotational speed of the drum to which are fastened the wires 180 that are not elongated. As a result, the member 76 to be supported is raised or lowered maintaining a horizontal attitude. Thus, the wire drive mechanism 78 of the present invention changes the winding speed depending on the winding torque of the wires 180.

Figure 38:
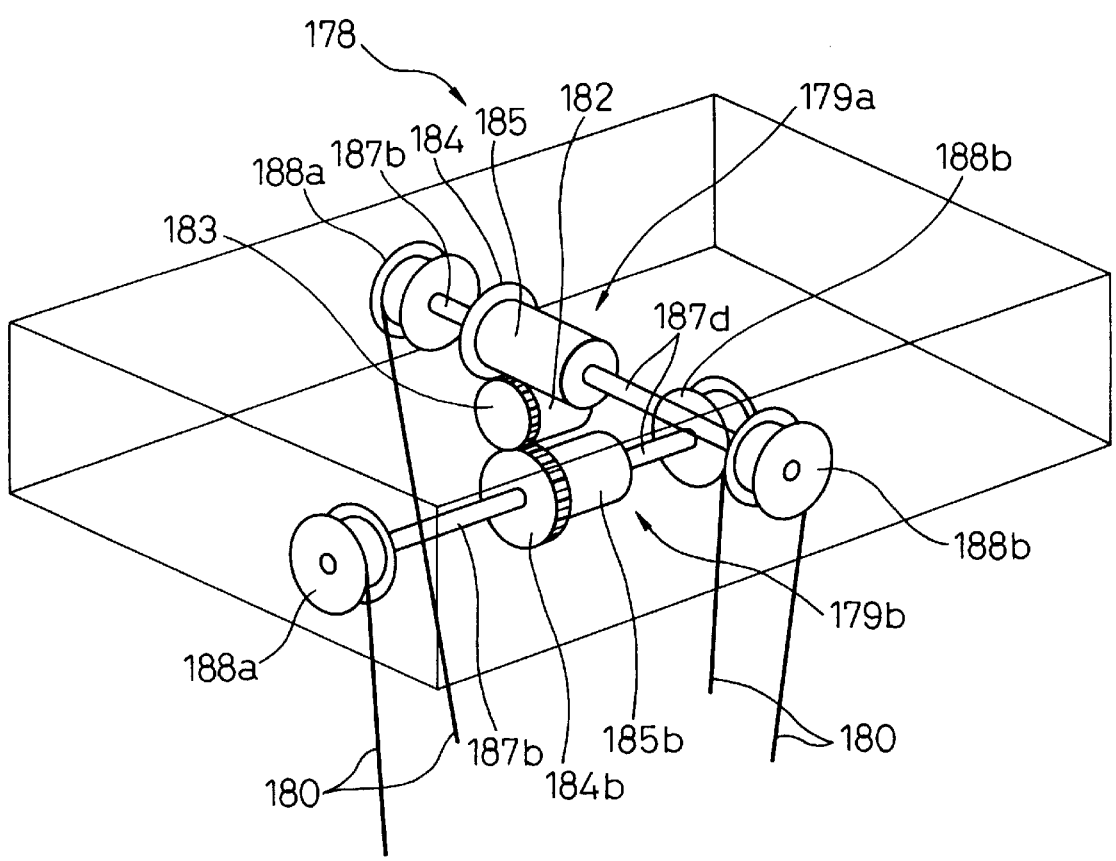
FIG. 38 is a view illustrating a modified example of the wire drive mechanism of FIG. 37.

FIG. 38 is a view illustrating a modified embodiment of the wire drive mechanism 178 of FIG. 37.

This wire drive mechanism 178 includes two differential gear mechanisms 179*a* and 179*b*. That is, as the differential gear mechanism 179*a*, the wire drive mechanism 178 comprises a motor 182, a motor gear 183, a gear 184 engaging with the motor gear 183, and a differential case 185 that is secured to the gear 184 and rotates together with the gear 184. Four bevel gears (186*a*, 186*b*, 186*c*, 186*d* in FIG. 37) are arranged in the differential case 185, and shafts (187*a*, 187*b*, 187*c*, 187*d* in FIG. 37) are secured to these bevel gears. Among these shafts, the shafts 187*b* and 187*d* are rotatably supported by the differential case 185 and extend through the differential case 185. A drum 188*a* is attached to an end of the shaft 187*b*, and a drum 188*b* is attached to an end of the shaft 187*d*. An end of a wire 180 is fastened to one drum 188*a* and an end of another wire 180 is fastened to the other drum 188*b*.

As another differential gear mechanism 179*b*, the wire drive mechanism 178 comprises the motor 182, the motor gear 183, a gear 184*b* engaging with the motor gear 183, and a differential case 185*b* that is secured to the gear 184*b* and rotates together with the gear 184*b*. The motor 182 and the motor gear 183 are commonly used for the differential gear mechanism 179*a*. The motor gear 183, gear 184 and gear 184*b* are bevel gears and their axes are arranged to intersect at right angles with one another.

The four bevel gears (186*a*, 186*b*, 186*c*, 186*d* of FIG. 37) are arranged in the differential case 185, and the shafts (187*a*, 187*b*, 187*c*, 187*d* of FIG. 37) are secured to these bevel gears. Among the above shafts, the shafts 187*b* and 187*d* are rotatably supported by the differential case 185 and extend passing through the differential case 185. The drum 188*a* is attached to an end of the shaft 187*b* and the drum 188*b* is attached to an end of the shaft 187*d*. An end of a wire 180 is fastened to one drum 188*a* and an end of another wire 180 is fastened to the other drum 188*b*.

Therefore, the four wires 180 change their winding speeds depending on their winding torques.

According to the present invention as described above, the substrates are stably and economically conveyed in a state of being contained in the carrier contributing to accomplishing the efficient production. According to the present invention, further, when use is made of an elevator including a plurality of wires, an article is raised and lowered by the plurality of wires while maintaining a horizontal attitude.

What is claimed is:

1. A work conveying and transferring apparatus comprising:
    a trolley having a housing defining a substantially hermetically sealed space and having an opening and closing window;
    a support portion provided in said housing of said trolley for placing at least one container containing a cassette carrying works;
    a container opening device provided in said trolley to open said container placed in said support portion; and
    a cassette transferring device provided in said trolley for transferring a cassette from said trolley to a treating apparatus with said container placed on said support portion opened and for transferring a cassette from said treating apparatus to said trolley;
    wherein said works are double sealed by said housing and by said container; and
    wherein said container includes a base portion, a cover portion mounted on said base portion and a locking device for locking said cover portion to said base portion, said container opening device is a cover opening device for lifting said cover portion from said base portion, and an unlocking device is provided for unlocking said locking device.

2. A work conveying and transferring apparatus according to claim 1, wherein said container is formed as a cup-like cover for covering the work accommodating cassette from above, and said container opening device comprises a cover opening device which lifts said cup-like cover.

3. A work conveying and transferring apparatus according to claim 2, further comprising a clean air feeding device provided in said trolley for feeding clean air into said sealed space, said clean air feeding device being operated by an electric power, the supply of the electric power to said clean air feeding device is established by a connector connection between connector member provided in said trolley and a connector member provided in said treating apparatus;
    the connector members being arranged to supply the electric power from said treating apparatus to said trolley when said first positioning member is operated, and a current supply switch is provided between said connector and said clean air-feeding means;
    said work transferring device being pneumatically operated, the supply of actuating air to said work transferring device being established by a coupling connection between a coupling member provided in said trolley and a coupling member provided in said treating apparatus; and
    said current supply switch being operated by the pneumatic pressure introduced by the coupling connection.

4. A work conveying and transferring apparatus according to claim 1, further comprising a data transfer means provided in said trolley for transferring data between said trolley and said treating apparatus without connecting wires.

5. A method of inspecting a container having a base portion, a cover portion mounted on said base portion and a locking device for locking said cover portion to said base portion, said container being adapted to contain works, the method comprising the steps of:
    hermetically maintaining a gas in said container under pressure; and
    measuring a force applied to said cover portion to inspect a function of the locking device.

6. A method of inspecting a container according to claim 5, wherein a force exerted on the cover portion is detected as a load current of a motor that opens and closes said covering portion.

7. A method of inspecting a container according to claim 5, further comprising the step of recovering cleanliness in the container by introducing a gas into the sealed container, releasing said gas from the container, introducing the gas again into the container, releasing the gas from the container, and repeating the cycle several times.

8. A method of treating works and a container, the container having a base portion, a cover portion mounted on said base portion and a locking device for locking said cover portion to said base portion, said method comprising the steps of:
    hermetically maintaining a gas in the container containing works under pressure;
    measuring a force applied to the cover portion to inspect a function of the locking device; and
    taking the works from said container containing said works and transferring them to a treating apparatus.

9. A work conveying and transferring apparatus comprising:
    a trolley having a housing defining a substantially hermetically sealed space and having an opening and closing window;
    a support portion provided in said housing of said trolley for placing at least one container containing a cassette carrying works;
    a container opening device provided in said trolley to open said container placed in said support portion; and a cassette transferring device provided in said trolley for transferring a cassette from said trolley to a treating apparatus with said container placed on said support portion opened and for transferring a cassette from said treating apparatus to said trolley;

wherein said works are double sealed by said housing and by said container; and wherein said work transferring device is pneumatically operated, and the supply of actuating air to said work transferring device by is established a coupling connection between a coupling member provided in said trolley and a coupling member provided in said treating apparatus.

10. A work conveying and transferring apparatus comprising:

a trolley having a housing defining a substantially hermetically sealed space and having an opening and closing window;

a support portion provided in said housing of said trolley for placing at least one container containing a cassette carrying works;

a container opening device provided in said trolley to open said container placed in said support portion; and a cassette transferring device provided in said trolley for transferring a cassette from said trolley to a treating apparatus with said container placed on said support portion opened and for transferring a cassette from said treating apparatus to said trolley;

wherein said works are double sealed by said housing and by said container; and further comprising a first positioning member for mechanically positioning said trolley relative to said treating apparatus and a second positioning member for pneumatically positioning said trolley relative to said treating apparatus, said second positioning member having a locking function which accurately positions said trolley relative to said treating apparatus and locks said trolley to said treating apparatus.

* * * * *